(12) United States Patent  (10) Patent No.: US 7,170,745 B2
Bash et al.  (45) Date of Patent: Jan. 30, 2007

(54) ELECTRONICS RACK HAVING AN ANGLED PANEL

(75) Inventors: Cullen Edwin Bash, San Francisco, CA (US); Martin Fraser Arlitt, Calgary (CA); Ratnesh K. Sharma, Union City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 46 days.

(21) Appl. No.: 10/425,624

(22) Filed: Apr. 30, 2003

(65) Prior Publication Data

US 2004/0218355 A1 Nov. 4, 2004

(51) Int. Cl.
*H05K 7/20* (2006.01)
(52) U.S. Cl. .................. 361/695; 312/265.1; 165/80.3; 454/184
(58) Field of Classification Search .................. 211/26; 312/265.1; 165/80.3; 361/687–696; 454/184
See application file for complete search history.

(56) References Cited

U.S. PATENT DOCUMENTS

| 3,874,444 | A |   | 4/1975  | Perce et al. |
| 5,497,573 | A | * | 3/1996  | Stadjuhar et al. .............. 40/564 |
| 5,718,628 | A | * | 2/1998  | Nakazato et al. ........... 454/184 |
| 6,164,369 | A | * | 12/2000 | Stoller .................... 165/104.33 |
| 6,775,137 | B2 | * | 8/2004 | Chu et al. .................... 361/696 |
| 2001/0042616 | A1 |   | 11/2001 | Baer |
| 2002/0059804 | A1 |   | 5/2002  | Spinazzola et al. |
| 2003/0067745 | A1 |   | 4/2003  | Patel et al. |

* cited by examiner

*Primary Examiner*—Gregory Thompson

(57) ABSTRACT

A rack has a frame for supporting one or more electronic components. The frame includes a front side and a rear side. An angled panel is positioned on at least one of the front side and the rear side. The angled panel extends for a substantial portion of the frame and is configured to vary airflow through the rack.

51 Claims, 12 Drawing Sheets

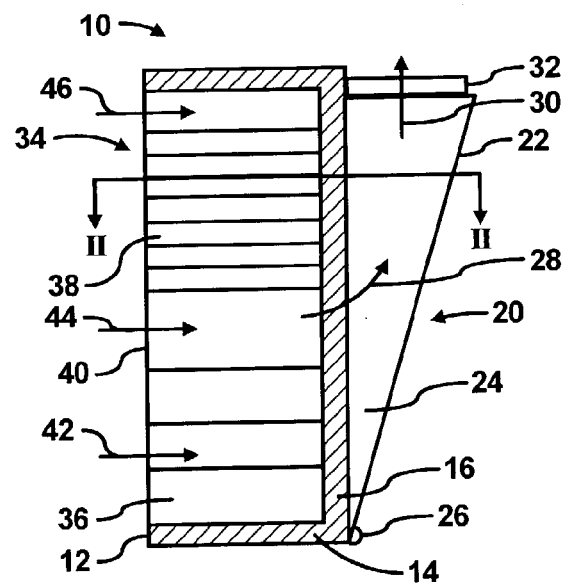
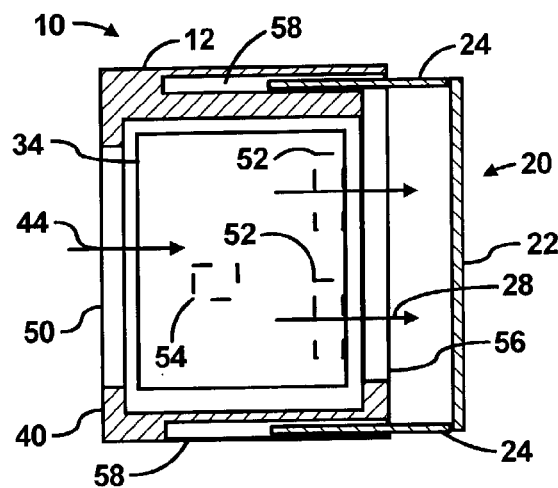
FIG. 1
FIG. 2
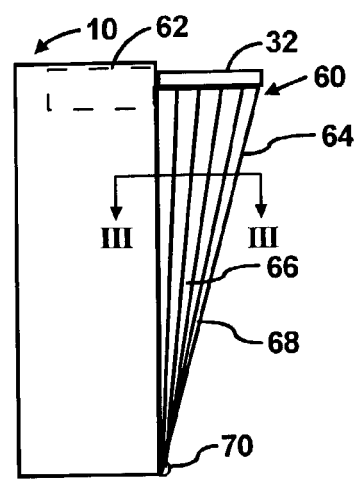
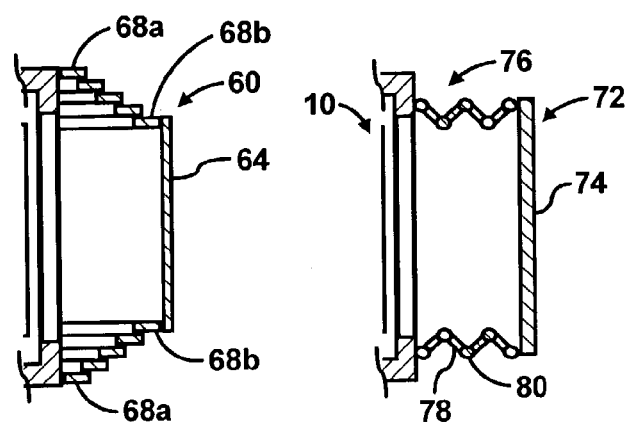
FIG. 3A
FIG. 3B
FIG. 3C

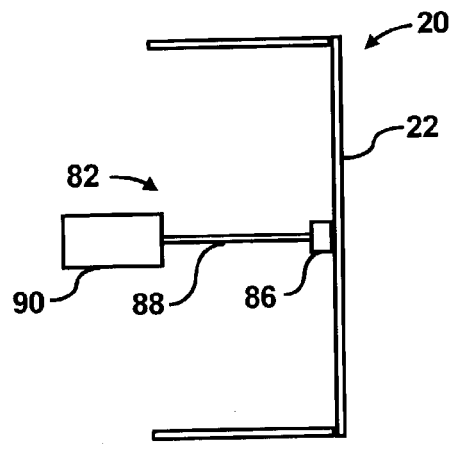
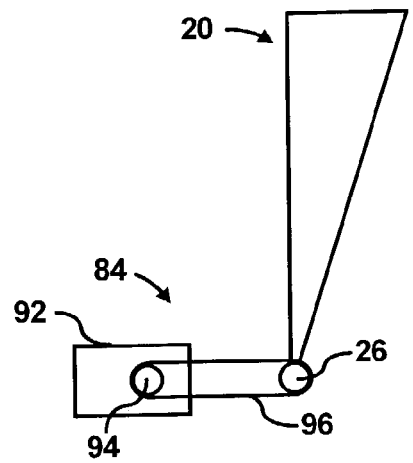
FIG. 4A
FIG. 4B
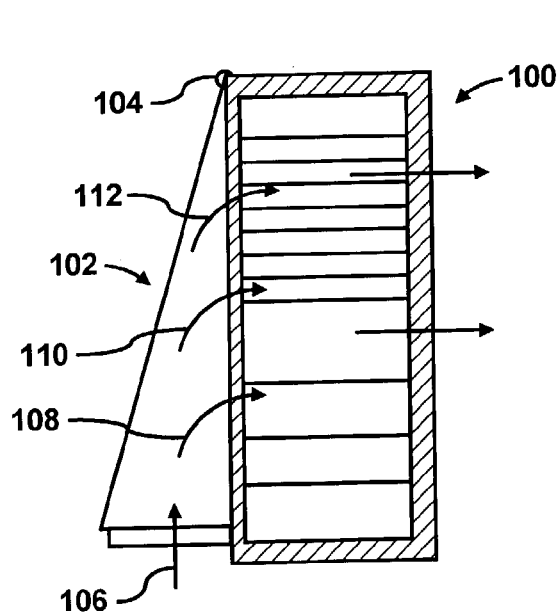
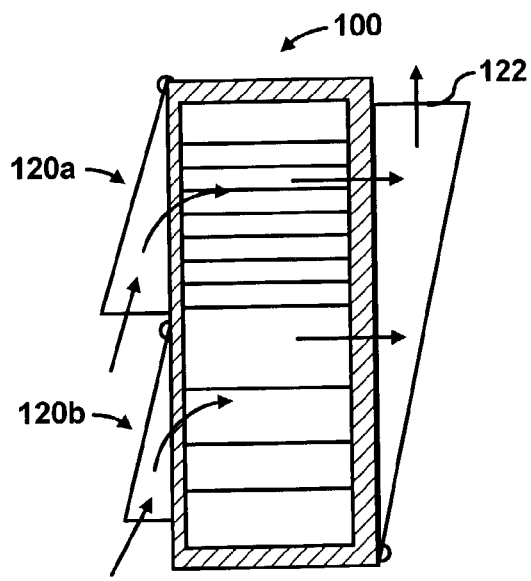
FIG. 5A
FIG. 5B

ELECTRONICS RACK HAVING AN ANGLED PANEL

BACKGROUND OF THE INVENTION

A data center may be defined as a location, e.g., room, that houses computer systems arranged in a number of racks. A standard rack, e.g., electronics cabinet, is defined as an Electronics Industry Association (EIA) enclosure, 78 in. (2 meters) wide, 24 in. (0.61 meter) wide and 30 in. (0.76 meter) deep. These racks are configured to house a number of computer systems, e.g., about forty (40) systems, with future configurations of racks being designed to accommodate up to eighty (80) systems. The computer systems typically include a number of components, e.g., one or more of printed circuit boards (PCBs), mass storage devices, power supplies, processors, micro-controllers, semi-conductor devices, and the like, that may dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, conditioned air, etc., across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more air conditioning units. For example, compressors of air conditioning units typically require a minimum of about thirty (30) percent of the required operating energy to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. For example, air conditioning systems are typically designed around the maximum capacity and redundancies are utilized so that the data center may remain on-line on a substantially continual basis. However, the computer systems in the data center typically utilize around 30–50% of the maximum cooling capacity. In this respect, conventional cooling systems often attempt to cool components that are not operating at a level which may cause their temperatures to exceed a predetermined temperature range. Consequently, conventional cooling systems often incur greater amounts of operating expenses than may be necessary to sufficiently cool the heat generating components contained in the racks of data centers.

Another factor that affects the efficiency of the cooling systems is the level of air re-circulation present in the data center. That is, conventional racks are not designed to reduce mixing of the cooling fluid with heated air. Thus, cooling fluid delivered to the racks mixes with air heated by the components thereby decreasing the effectiveness of the cooling fluid in cooling the components. In addition, heated air mixes with the cooling fluid thereby decreasing the temperature of the air returning to the air conditioning unit and thus the efficiency of the heat transfer at the air conditioning unit.

SUMMARY OF THE INVENTION

According to one embodiment, the present invention pertains to a rack having a frame for supporting one or more electronic components. The frame includes a front side and a rear side. An angled panel is positioned on at least one of the front side and the rear side. The angled panel extends for a substantial portion of the frame and is configured to vary airflow through the rack.

BRIEF DESCRIPTION OF THE DRAWINGS

Features of the present invention will become apparent to those skilled in the art from the following description with reference to the figures, in which:

FIG. 1 is a side elevational view, partly in cross-section, of a rack according to an embodiment of the invention;

FIG. 2 illustrates a cross-sectional view along lines II—II of FIG. 1, according to an embodiment of the invention;

FIGS. 3A–3C illustrate an angled panel according to an embodiment of the invention;

FIGS. 4A and 4B illustrate actuating systems for varying the position of an angled panel according to embodiments of the invention;

FIGS. 5A and 5B illustrate side elevational views, partly in cross-section, of a rack according to other embodiments of the invention;

DETAILED DESCRIPTION OF THE INVENTION

Figure 6:
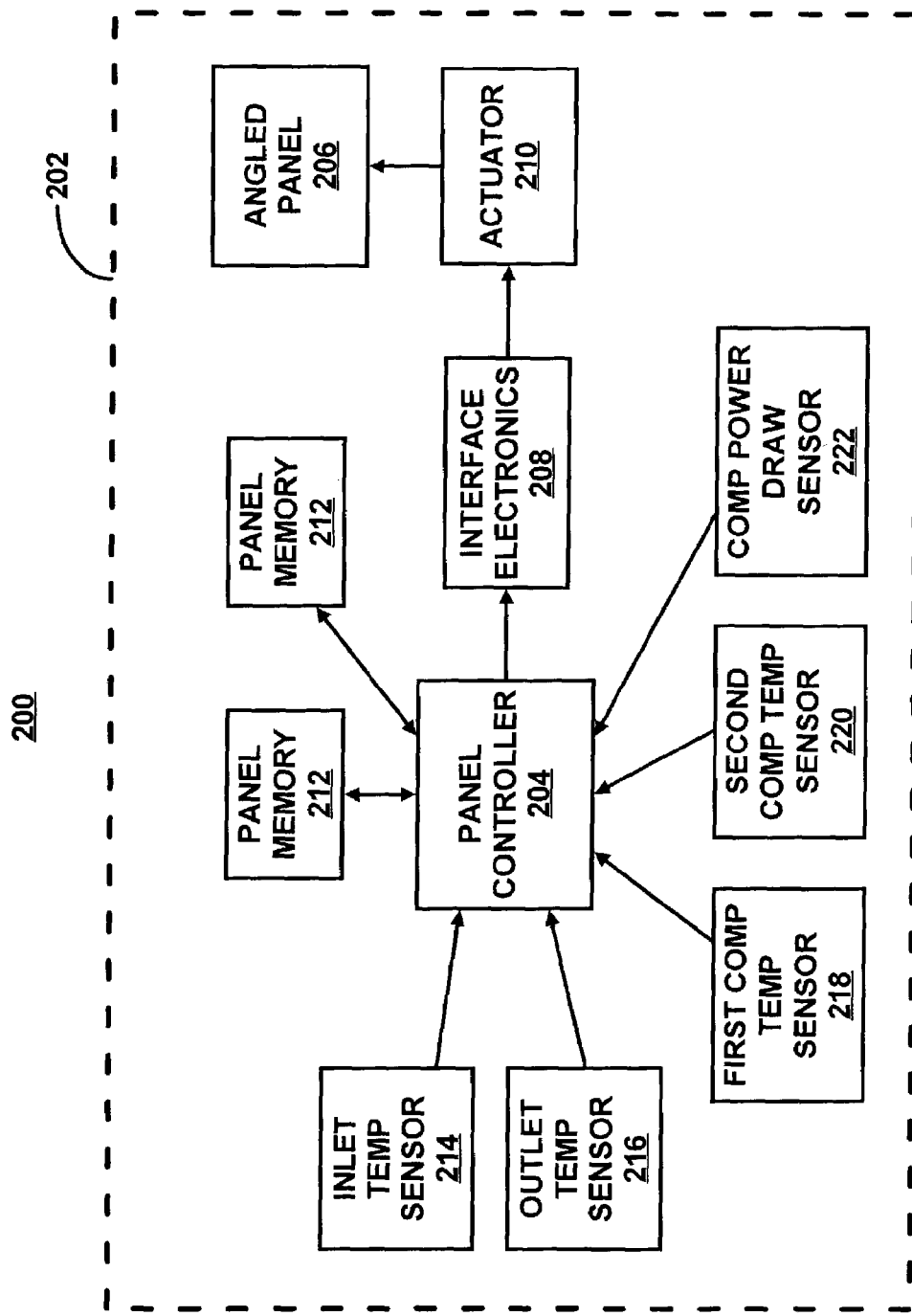
FIG. 6 is an exemplary block diagram for a panel system according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Throughout the present disclosure, reference is made to "cooling fluid" and "heated air". For purposes of simplicity, "cooling fluid" may generally be defined as air that has been cooled by a cooling device, e.g., an air conditioning unit. In addition, "heated air" may generally be defined as air, or cooling fluid, that has been heated, e.g., cooling fluid that has received heat from a heat generating component. It should be readily apparent, however, that the terms "cooling fluid" are not intended to denote air that only contains cooled air and that "heated air" only contains air that has been heated. Instead, embodiments of the invention may operate with air that contains a mixture of heated air and cooling fluid.

According to embodiments of the invention, a rack, e.g., electronics cabinet, designed to house a plurality of heat generating components, e.g., servers, computers, processors, micro-controllers, high speed video cards, memories, semi-conductor devices, and the like, contains a rear panel configured to vary the flow of heated air exhausting from the rack. The rear panel may be actuated to enable control, e.g., magnitude and/or direction, over removal of the air heated by components in the rack. In this regard, the rear panel may be coupled to an actuator designed to manipulate the angle of the movable panel with respect to the rack.

Alternatively, the rear panel may be angled in a substantially rigid manner with respect to the rack. In any case, a fan or a blower may be mounted along the rear panel to enable greater control over the flow of exhausting heated air.

A controller may be provided to operate the actuator(s) and/or fan substantially based upon input received from environmental condition sensing devices, e.g., temperature sensors, pressure sensors, humidity detectors, etc.

In one respect, a data center may contain one or more racks having rear panels configured to vary the mass flow rate of heated air exhausting from the rack. The rear panels of the racks may be operated in a manner to generally control airflow within the data center. More specifically, the rear panels may be operated to substantially reduce or eliminate re-circulation of the cooling fluid and the heated air. By controlling the re-circulation of the air in the data center, the efficiency of heat transfer from heat generating components to the cooling fluid may be increased. In addition, the efficiency of the heat transfer from the heated air to the cooling device may also be increased. One result is that the amount of energy required to operate cooling systems in the data center may be reduced, thereby reducing the costs associated with operating a data center.

According to another embodiment of the invention, the flow rate of airflow through the rack(s) may substantially be balanced with the flow rate of airflow through vent(s) configured to supply the rack(s) with cooling fluid. By balancing the flow rates, the rack(s) may receive substantially only the cooling fluid supplied through the vent(s). In this regard, the amount of airflow into the rack(s) having temperatures higher than the supplied cooling fluid may be reduced. Thus, the temperature of the cooling fluid delivered to cool the components in the rack(s) may be substantially optimized to thereby enable greater heat transfer from the components over known cooling systems.

According to further embodiments of the invention, control of the rear panels may substantially be based upon the operation of a smart cooling system. That is, operations of the rear panels may substantially be based upon, for example, conditions of cooling fluid supplied to the racks. By way of example, the airflow through the rear panels may substantially be based upon the smart cooling techniques described in co-pending U.S. application Ser. No. 09/970,707, filed on Oct. 5, 2001, which is assigned to the assignee of the present invention and is hereby incorporated by reference in its entirety.

As illustrated in FIG. 1, there is shown a side elevational view, partly in cross-section, of a rack 10 according to an embodiment of the invention. It should be readily apparent to those of ordinary skill in the art that the rack 10 depicted in FIG. 1 represents a generalized illustration and that other components may be added or existing components may be removed or modified without departing from the scope of the invention. For example, the rack 10 may include legs for supporting the rack 10 above the ground and for enabling leveling of the rack 10.

The rack 10 includes a frame 12 having horizontally extending members 14 and a vertically extending member 16. The horizontally extending members 14 and the vertically extending member 16 may be fastened to each other near their extremities. In addition, they may be fastened according to any known suitable manner, e.g., welds, threaded fasteners, rivets, adhesives and the like. The frame 12 may be sized according to industry standards, such as those described hereinabove. The frame 12 may include additional horizontally and vertically extending members on one or more sides thereof (not shown) to provide a substantially stable structure. In addition, the frame 12 may include a front panel as well as side panels.

An angled panel 20 is illustrated as being attached to a rear of the frame 12 via a hinge member 26. Alternatively, the angled panel 20 may be substantially rigidly attached to the frame 12 without departing from the scope of the invention. That is, the angled panel 20 may have a substantially fixed angle with respect to the frame 12. The angle at which the angled panel 20 is positioned with respect to the rack 10 may be based upon a plurality of factors. For example, the angle may be selected according to the type of computational work to be performed in the rack, e.g., the types of electronic devices located in the rack, the location of the rack 10 with respect to other racks in a data center, characteristics of the airflow through the rack 10 based upon the components located therein, location of air condition return ventilation, flow rate and heat load generated by equipment in the rack, etc.

The angled panel 20 may comprise any reasonably suitable material, e.g., plastic, metal, alloys, composites, arid the like. In addition, the angled panel 20 may comprise any reasonably suitable construction, e.g., a substantially solid surface, perforations, angled surfaces, etc. As seen in FIG. 1, the angled panel 20 generally comprises a wedge shape having a first wall 22 and a pair of second walls 24 (only one second wall 24 is visible in FIG. 1). The walls 22, 24 of the angled panel 20 generally enable airflow out of the rack 10 (arrow 28) to be directed in a generally upward direction as indicated by the arrow 30. In addition, the angled panel 20 may comprise a movable louver system as disclosed and described in co-pending and commonly assigned U.S. patent application Ser. No. 10/425,621, filed on Apr. 30, 2003, entitled "Louvered Rack", which is hereby incorporated by reference in its entirety. As described in that application, a panel may include a louver device configured to vary the flow of air through the panel. In this regard, for example, the flow of heated air may be directed substantially upward through an opening of the angled panel and through a louvered panel located along one or more walls of the angled panel.

A fan or a blower 32 may be positioned to assist the airflow out of the rack 10 and out of the angled panel 20. The fan 32 may be positioned at any location along the height of the angled panel; however, according to an embodiment of the invention, the fan 32 is positioned substantially near a top end of the angled panel 20 to essentially prevent re-circulation of the heated airflow back into the rack 10. Because the specific type of fan 32 to be employed with embodiments of the invention may vary according to individual needs, the invention is not limited to any specific type of fan. Instead, any reasonably suitable type of fan 32 capable of accomplishing certain embodiments of the invention may be employed. The choice of the fan 32 may depend upon a plurality of factors, e.g., cooling requirements, costs, operating expenses, etc.

As stated hereinabove, the rack 10 generally houses a plurality of electronic components 34, e.g., heat generating components. The electronic components 34 may comprise a power supply 36 as well as servers, computers, processors, micro-controllers, high speed video cards, memories, semi-conductor devices, and the like. The electronic components 34 may be supported on rails or shelves 38 attached to the frame 12. In addition, the electronic components 34 may include temperature sensors (not shown) and fans (not shown) configured to increase airflow through the electronic components 34. The electronic components 34 may be provided with temperature sensors and/or fans by their manufacturers. Alternatively, the temperature sensors and/or fans may be installed after the heat generating components 34 are manufactured.

Although not illustrated in FIG. 1, the rack 10 may include temperature sensors located at various positions of the rack 10. For example, the rack 10 may include one or more temperature sensors located at the inlet and one or more temperature sensors located at the outlet. The temperature sensors configured to determine the temperature of the cooling fluid entering into the rack 10 and the temperature sensors configured to determine the temperature of the heated air exhausted from the rack 10 may be installed prior to installation of the electronic components 34. In this respect, the rack 10 may be manufactured with these temperature sensors. Alternatively, these temperature sensors may be installed after installation of the electronic components 34.

The angled panel 20 may constitute any side of the rack 10. That is, the angled panel 20 may comprise either a side of the rack 10 that receives cooling fluid or a side of the rack that exhausts heated air. It should therefore be understood that any side and the top of the rack 10 may comprise the angled panel 20 without departing from the scope of the invention. By way of example, the rack 10 may be designed to receive cooing fluid through two sides thereof and exhaust heated air through two sides thereof. For purposes of simplicity, and not of limitation, throughout the present disclosure the front 40 of the rack 10 will be described as a side that receives cooling fluid and the rear of the rack 10 will be described as a side that exhausts heated air.

As shown in FIG. 1, the front 40 is relatively open to enable cooling fluid to flow into the rack 10 as generally indicated by the arrows 42–46. The arrow 42 generally indicates cooling fluid flow supplied to the power supply 36 and the arrows 44 and 46 generally indicate cooling fluid flow to some of the electronic components 34. It should be understood that a panel having vents to enable the cooling fluid to flow into the rack 10 may cover the front 40 of the rack 10.

FIG. 2 illustrates a cross-sectional view of the rack 10 along lines II—II of FIG. 1, according to an embodiment of the invention. As shown in FIG. 2, the rack 10 includes an opening 50 for cooling fluid to enter into the rack 10 as generally indicated by the arrow 44. The cooling fluid may flow into or around the electronic component 34 to absorb heat generated therein and to thereby cool the electronic component 34. To enable greater airflow, the electronic component 34 is illustrated as comprising a pair of fans 52.

The electronic component 34 also includes a temperature sensor 54. The temperature sensor 54 may comprise a thermocouple, thermistor, and the like. The temperature sensor 54 may be configured to transmit temperature measurements to a controller (not shown) of fans 52. In this regard, the fans 52 may be operated according to the detected temperature of the electronic component 34. For instance, the fans 52 may operate to create greater airflow through the electronic component 34 as the measured temperature increases. Alternatively, the fans 52 may be configured to operate when the electronic component 34 is operational and to enter into an idle or sleep state when the electronic component 34 is not operational.

In any respect, the fans 52 also operate to assist in the exhaust of heated air out of the area of the electronic component 34 as well as the rack 10. The heated air may flow out of the rack 10 through an outlet 56 located on a rear of the rack 10 as indicated by the arrows 28. It should be understood that the outlet 56 may comprise an opening extending substantially along the height of the rack 10 or a plurality of outlets 56 may be located along the height of the rack 10 without departing from the scope of the invention.

According to an embodiment of the invention, the rack 10 may include a pair of slots 58 configured to receive the side walls 24 of the angled panel 20. In this regard, the side walls 24 of the angled panel 20 may comprise substantially rigid barriers. Thus, as the angle of the angled panel 20 varies with respect to the rack 10, the slots 58 generally provide spaces to house the side walls 24.

FIGS. 3A and 3B illustrate an angled panel 60 according to an embodiment of the invention. With reference first to FIG. 3A, the rack 10 includes an opening 62 configured to receive the fan 32 as the angle between angled panel 60 and the rack 10 is reduced. In addition, the angled panel 60 includes a rear wall 64 and a pair of side walls 66. The side walls 64 are composed of a plurality of slats 68 pivotable about an axis 70.

Referring now to FIG. 3B, there is shown a cross-sectional view along lines III—III of FIG. 3A. As shown in FIG. 3B, the slats 68 are positioned in an offset relationship to one another. The slats 68 are configured to translate with respect to adjacent ones of the slats 68 between a minimum distance and a maximum distance. The minimum distance generally relates to the closest position attainable by the rear wall 64 to the rack 10. In this position, the slats 68 substantially overlap with adjacent slats 68. The maximum distance generally relates to the farthest position attainable by the rear wall 64 from the rack 10. In this position, opposite ends of the stats 68 substantially overlap with the ends of adjacent slats 68. The slats 68 may thus be attached to one another to generally enable lateral movement about the axis 70 with respect to each other. In this regard, the slats 68 may create a barrier regardless of the angle between the rear wall 64 and the rack 10.

One of the slats 68a of a side wall 66 is substantially fixedly attached to a rear of the panel 10. Another of the slats 68b of a side wall 66 is substantially fixedly attached to the rearwall 64. Thus, by manipulating the rear wall 64 to vary its angle with respect to the rack 10, the positions of the slats 68 may also be varied to provide the barrier.

FIG. 3C illustrates an angled panel 72 taken along line III—III according to a further embodiment of the invention. The angled panel 72 includes a rear wall 74 and a pair of side walls 76. The side walls 76 are composed of slats 78 and hinges 80 and are hingedly attached to the rear wall 74 and the rack 10. In addition, the bottom ends of the slats 78 may be attached to a common axis, e.g., axis 70. Alternatively, the bottom ends of the slats 78 may be attached to a bottom wall (not shown) having a similar configuration to the side walls 76. Therefore, as the rear wall 74 is manipulated with respect to the rack 10, the side walls 74 generally operate in an accordion-like manner to create a barrier regardless of the position of the rear wall 74 with respect to the rack 10.

Although specific examples of the side walls 24, 66, and 76 are set forth above, it should be understood that the invention may be practiced with other side wall configurations capable of performing the functions cited above without departing from the scope of the invention. For example, the side walls 24 may be composed of a substantially flexible and elastic material configured to create a barrier for various positions of the rear wall 22 with respect to the rack 10. In addition, the side walls 24 may comprise perforations.

FIGS. 4A and 4B illustrate actuating systems 82, 84 for varying the position of the angled panel 20 according to embodiments of the invention. One of ordinary skill in the art should recognize that the embodiments of the actuating systems 82, 84 depicted in FIGS. 4A and 4B represent generalized illustrations and that other actuating systems may be implemented without departing from the scope of the invention. Other suitable actuating systems may include, for example, a screw-drive system, piston and spring system, and the like.

Referring first to FIG. 4A, a connecting member 86 is depicted as being connected to the rear wall 22 of the angled panel 20. One end of a shaft 88 is connected to the connecting member 94 and the other end of the shaft 88 is attached to a drive member 90. The drive member 90 is configured to vary the length of the shaft 88 between the drive member 90 and connecting member 86 to thereby vary the angle between the rear wall 22 and the rack 10. Thus, for example, the drive member 90 may pneumatically operate the shaft 88 to reduce or increase its length. The connecting member 86 may be pivotally attached to the rear wall 22 or to the shaft 88. In addition, the drive member 90 may be pivotally attached to the rack 10. The pivotal attachment between these elements may be accomplished in any reasonably suitable manner known to those of ordinary skill in the art to enable the angle of the rear wall 22 to be varied with respect to the rack 10.

As shown in FIG. 4B, the actuating system 84 includes an actuating device 92 having a drive shaft 94. The drive shaft 94 is coupled to a drive belt 96, which is also coupled to the hinge member 26. The coupling between the drive belt 96 and the hinge member 26 may comprise any reasonably suitable known manner, e.g., tongue and groove, frictional engagement, etc. The actuating device 92 is configured to rotate the drive shaft 94 in either direction and thus may comprise a direct current (DC) motor or the like. As the drive shaft 94 is rotated, the drive belt 96 is also rotated thereby causing the hinged member 26 to rotate. Therefore, the angle of the angled panel 20 with respect to the rack 10 may be varied by operation of the actuating device 92.

FIGS. 5A and 5B illustrate side elevational views, partly in cross-section, of a rack 100 according to other embodiments of the invention. The rack 100 depicted in FIGS. 5A and 5B represent generalized illustrations. Therefore, other components may be added or existing components may be removed or modified without departing from the scope of the invention.

With reference first to FIG. 5A, the rack 100 includes all of the elements described hereinabove with respect to the rack 10 in FIG. 1. One difference, however, is that an angled panel 102 is positioned at an inlet of the rack 100. The angled panel 102 may comprise the elements cited hereinabove with respect to the angled panel 20. In addition, the angled panel 102 may be substantially fixed with respect to the rack 100 or it may be operable to rotate about an axis 104.

The angled panel 102 is configured to substantially control the cooling fluid flow through an inlet of the rack 100 as denoted by the arrows 106–112. The inlet of the angled panel 102 may receive cooling fluid from a vent of a data center (not shown). As the air is supplied to the angled panel 102, the fan(s) 54 of the electronic components 34 may operate to draw air through the respective electronic components 34.

According to an embodiment of the invention, one or more of the angled panels 20 and 102 may be retrofitted onto a conventional rack. Thus, for example, the angled panel 20, 102 may be positioned on a side of the conventional rack. If necessary, an existing panel of the conventional rack may be removed to provide a space for the angled panel 20, 102 to be positioned thereon. Thus, for example, in a rack having front and rear panels, both panels may be removed and replaced with the angled panels 20. In addition, the components for operating the position of the angled panel 20, 102 as described hereinabove may also be retrofitted onto the conventional rack.

FIG. 5B is similar to FIG. 5A and generally contains all of the elements depicted therein. However, as shown in FIG. 5B, the rack 100 includes a pair of angled panels 120a, 120b. The angled panels 120a, 120b may be operated in substantially independent manners. That is, the angles at which the angled panels 120a, 120b are positioned with respect to the rack 100 may differ from one another. Therefore, the amount of airflow through the angled panels 120a, 120b may also differ and may be varied in substantially independent manners. Thus, as temperature conditions change within various sections of the rack 100, the cooling fluid delivered to the various sections may also be varied.

Although FIG. 5B illustrates the angled panels 120a, 120b as being located on the front of the rack 100, the angled panels 120a, 120b may also be positioned on the rear of the rack 100. In this instance, the angled panels 120a, 120b would be flipped along the horizontal axis to enable heated airflow to travel in a generally upward direction.

FIG. 6 is an exemplary block diagram 200 for a panel system 202 according to an embodiment of the invention. It should be understood that the following description of the block diagram 200 is but one manner of a variety of different manners in which such a panel system 202 may be operated. In addition, it should be understood that the panel system 202 may include additional components and that some of the components described may be removed and/or modified without departing from the scope of the invention.

The panel system 202 includes a panel controller 204 configured to control the operations of an angled panel 206, e.g., angled panel 20, 60, 72, 102 (FIGS. 1–5). The panel controller 204 may comprise a microprocessor, a microcontroller, an application specific integrated circuit (ASIC), and the like. The panel controller 204 is generally configured to control the angle of the angled panel 206. More particularly, the panel controller 204 may be configured to vary the angle of the angled panel 206 to vary the airflow through a rack, e.g., rack 10, 100.

Interface electronics 208 may be provided to act as an interface between the panel controller 204 and an actuator 210 for operating the angled panel 206. The actuator 210 may comprise the drive member 90, the actuating device 92, or their equivalents. In this regard, the interface electronics 208 may instruct the actuator 210 to manipulate the angled panel 206 based upon input from the panel controller 204. By way of example, the interface electronics 208 may vary the voltage supplied to the actuator 210 to vary the direction and/or magnitude of rotation of a drive shaft (e.g., drive shaft 94) of the actuator 210 in accordance with instructions from the panel controller 204.

The panel controller 204 may also be interfaced with a panel memory 212 configured to provide storage of a computer software that provides the functionality of the panel system 202, e.g., the actuator 210, and maybe executed by the panel controller 204. The panel memory 212 may be implemented as a combination of volatile and non-volatile memory, such as DRAM, EEPROM, flash memory, and the like. The panel memory 212 may also be configured to provide a storage for containing data/information pertaining to the manner in which the actuator 210 may be manipulated in response to, for example, variations in the temperature of the cooling fluid and/or air flow characteristics at an inlet of a rack.

The panel controller 204 may receive environmental condition information from sensors located in and around the rack. An inlet temperature sensor 214, an outlet temperature sensor 216, a first component temperature sensor 218, and a second component temperature sensor 220 may detect and transmit the environmental condition information to the panel controller 204. The temperature sensors 214–220 may comprise thermocouples, thermistors, or are otherwise configured to sense temperature and/or changes in temperature. One or more inlet temperature sensor(s) 214 maybe located around one or more inlets of the panel system 202. In addition, one or more outlet temperature sensor(s) 216 may be located around one or more outlets of the panel system 202. In this regard, the temperatures of the cooling fluid entering through an inlet(s) and the temperatures of the heated air exhausting through the outlet(s) at various locations thereof may be substantially individually measured. The transmission of the temperature information may be effectuated through wired connections or through wireless protocols, such as IEEE 801.11b, 801.11g, wireless serial connection, Bluetooth, etc., or combinations thereof.

The first component temperature sensor 218 and the second component temperature sensor 220 may be positioned to respectively detect the temperatures around a first component (not shown) and a second component (not shown) housed in the rack. For example, the first component temperature sensor 218 and the second component temperature sensor 220 may comprise the temperature sensor 52 illustrated in FIG. 2. The first component temperature sensor 218 and the second component temperature sensor 220 may be provided by the component manufacturers. Alternatively, the first component temperature sensor 218 and the second component temperature sensor 220 may be installed onto manufactured components. In any regard, the panel controller 204 may receive information from the component temperature sensors 218 and 220 through wired connections or through wireless protocols, such as IEEE 801.11b, 801.11g, wireless serial connection, Bluetooth, etc., or combinations thereof. In addition, or in the alternative, the component temperature sensors 218, 220 may be configured to transmit the temperature information to a rack controller (not shown) that may be in communication with the panel controller 204 through a wired or a wireless connection.

A component power draw sensor 222 may also communicate with the panel controller 204. The component power draw sensor 222 may detect the amount of power being delivered to one or more components in the rack. The panel controller 204 may utilize the power draw information to predict the heat generated by the components. Thus, for example, the panel memory 212 may store information correlating the temperatures of the components based upon their power draws. By predicting the temperatures of the components, the panel controller 204 may vary the airflow through the rack to compensate for fluctuating heat generation by the components.

The panel controller 204 further includes a timer 224 configured to track times of various events occurring in the panel system 202. For example, the panel controller 104 may initiate the timer 224 in response to receipt of temperature readings from one or more of the components. In this regard, the panel controller 204 may initiate the timer 128 when a reading is received and may track the time when another reading is received.

According to an embodiment of the invention, the inlet temperature sensor 214, outlet temperature sensor 216, and the panel controller 204 may comprise location aware devices. Location aware devices are described in co-pending application Ser. No. TBD, filed on TBD Ser. No. 10/620, 272, entitled "LOCATION AWARE DEVICES", which is assigned to the assignee of the present invention and the disclosure of which is hereby incorporated by reference in its entirety. As described in that application, these devices are termed "location aware" because they are operable to determine their general locations with respect to other sensors and/or devices and to communicate with one another through wireless communications.

Through use of the location aware devices, the panel controller 204 may determine and store the locations of the various sensors, e.g., inlet temperature sensor 214, outlet temperature sensor 216, etc. The panel controller 204 may receive information pertaining to the components and their locations in the rack. Thus, for example, the panel controller 104 may manipulate the actuator 210 to vary the angle of the angled panel 206 to vary the airflow through the rack based upon the heat generated by the components.

Figure 7A:
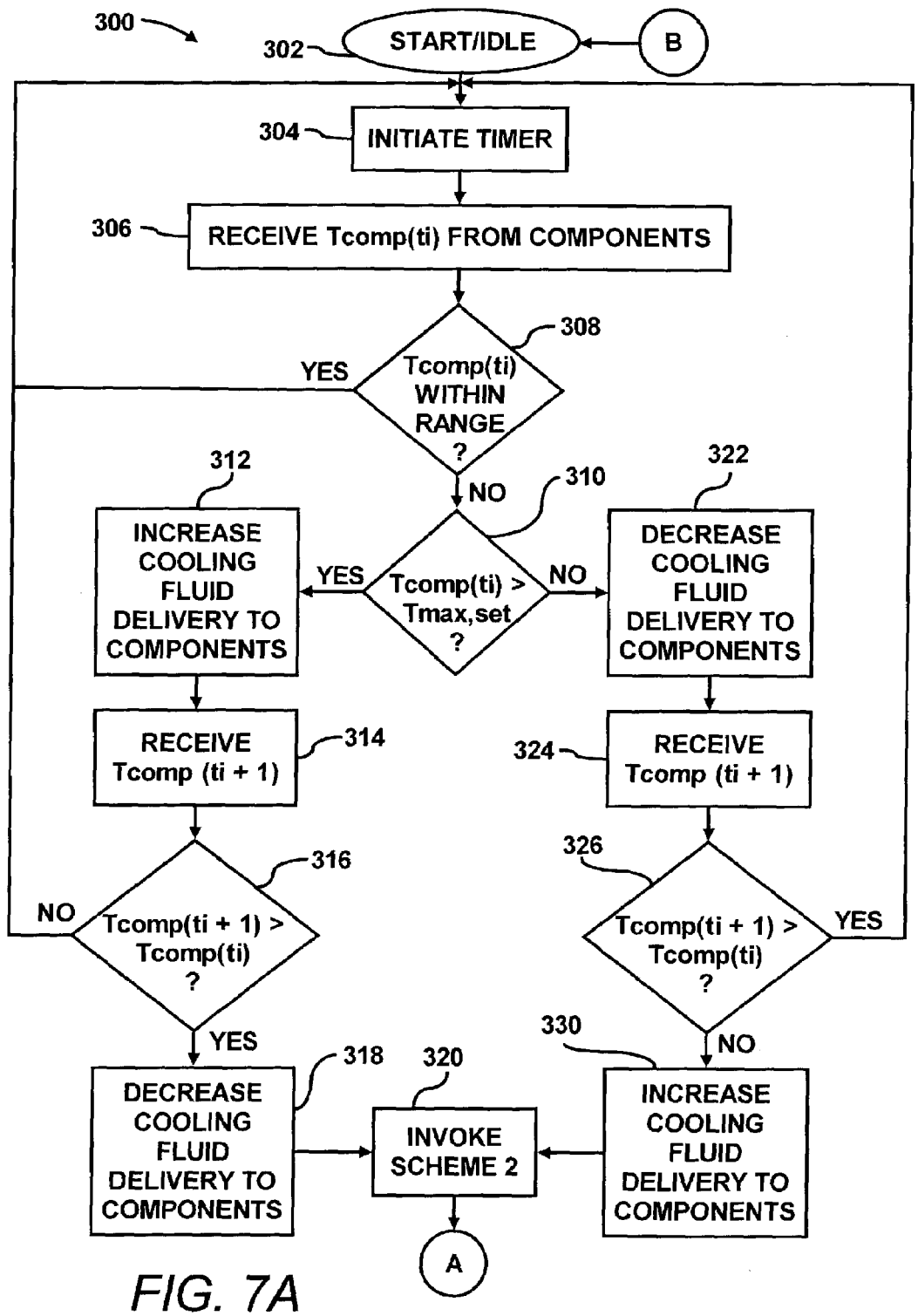
FIGS. 7A and 7B, collectively illustrate an exemplary flow diagram of an operational mode of a panel system according to an embodiment of the invention.
Figure 7B:
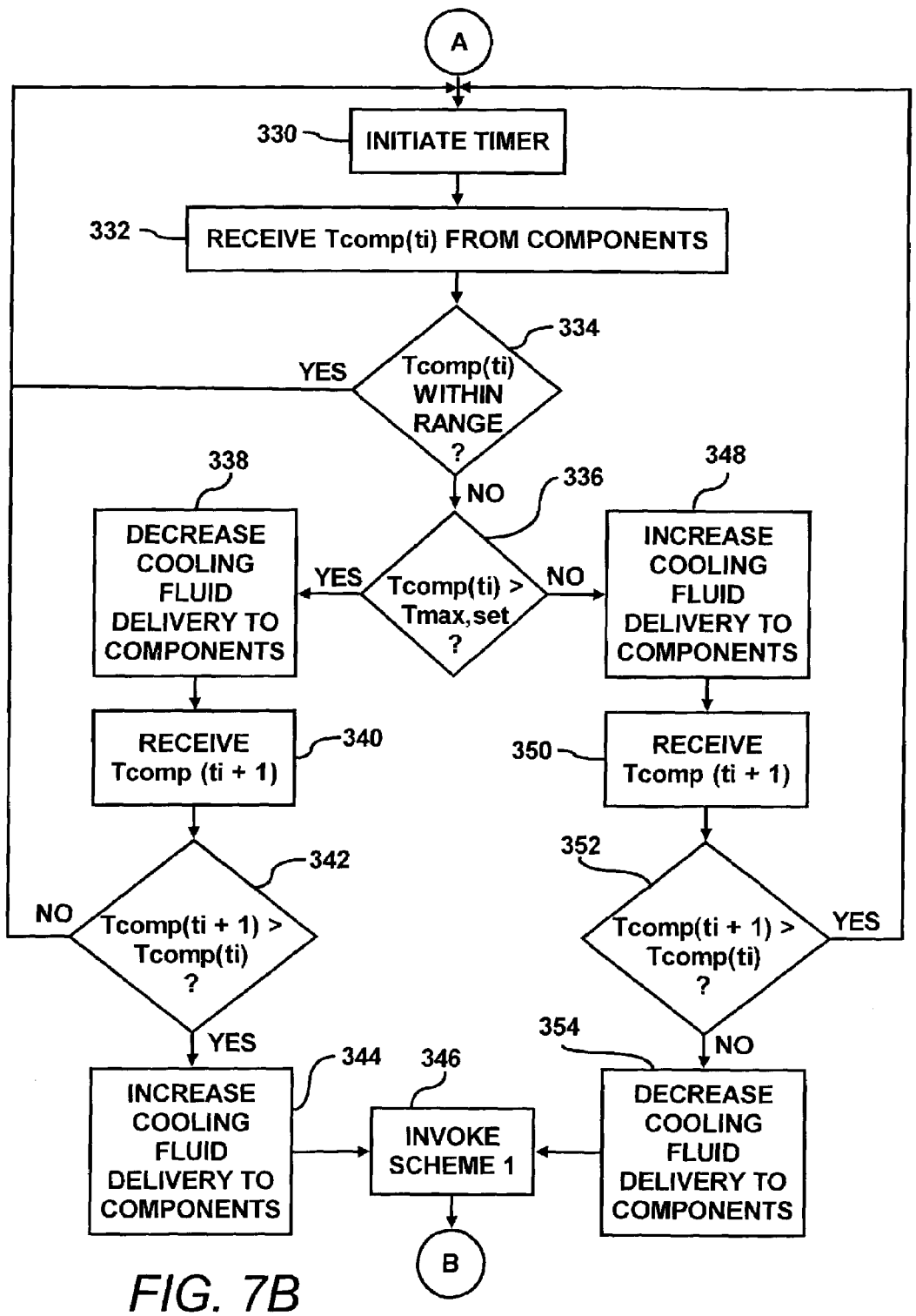

FIGS. 7A and 7B, collectively illustrate an exemplary flow diagram of an operational mode 300 of a panel system 202 according to an embodiment of the invention. It is to be understood that the following description of the operational mode 300 is but one manner of a variety of different manners in which an embodiment of the invention may be operated. It should also be apparent to those of ordinary skill in the art that the operational mode 300 represents a generalized illustration and that other steps may be added or existing steps may be removed or modified without departing from the scope of the invention. The description of the operational mode 300 is made with reference to the block diagram 200 illustrated in FIG. 6, and thus makes reference to the elements cited therein.

The panel controller 204 may implement the operational mode 300 to control the cooling fluid delivery into the rack and/or the heated airflow exhaust from the rack, depending upon the location(s) of the angled panel(s) 206. The operational mode 300 may be initiated in response to a variety of stimuli at step 302. For example, the operational mode 300 may be initiated in response to a predetermined lapse of time, in response to receipt of a transmitted signal, and/or in response to a detected change in an environmental condition (e.g., temperature, humidity, location, etc.).

At step 304, the panel controller 204 may initiate a timer, e.g., timer 224. The panel controller 204 may receive temperature information from one or more of the components 34 (Tcomp) at a first time (ti) housed in the rack 10 at step 306. As described hereinabove, temperature sensors 218, 220 of the components may communicate directly with the panel controller 204 (FIG. 6). Alternatively, the temperature sensors 218, 220 may communicate with a rack controller which may essentially relay the temperature information of the components to the panel controller 204.

The panel controller 204 may determine whether the Tcomp received at the first time (ti) is within predetermined ranges at step 308. The predetermined ranges for the components may be stored in the panel memory 212. The predetermined ranges may be defined as predetermined ranges of operating temperatures for the components, e.g., between a maximum set point temperature (Tmax,set) and a minimum set point temperature (Tmin,set). In general, the range of temperatures between Tmin,set and Tmax,set pertains to threshold temperatures that the panel controller 104 may use to determine whether to increase or decrease the flow of cooling fluid delivered to the components. This range of operating temperatures may be set according to a plurality of factors. These factors may include, for example, the operating temperatures set forth by the manufacturers of the components, through testing to determine the optimal operating temperatures, etc. In addition, the predetermined range of operating temperatures may vary from one component to another.

Thus, some of the components 34 may be within their respective predetermined operating ranges whereas other components may be outside their respective predetermined operating ranges, even when these components have similar temperatures. For those components having Tcomp's that are within their predetermined operating ranges, the panel controller 204 may substantially continuously receive temperature information (306). For those components having Tcomp's outside their predetermined operating ranges, it is determined whether the Tcomp's are above the Tmax,set for the components at step 310.

If the Tcomp's are above the Tmax,set, then the cooling fluid delivered to those components is increased at step 312. If an angled panel 206 is located on a front of the rack, the increase in cooling fluid delivery may be accomplished by manipulating the angled panel 206 to enable a greater mass flow rate of the cooling fluid therethrough. Alternatively, if an angled panel 206 is provided on the rear of the rack, without an angled panel on the front of the angled panel, the angled panel 206 may be manipulated to increase the mass flow rate of heated air therethrough. If angled panels 206 are provided on the front and the rear of the rack, then they may both be manipulated to enable greater airflow through the rack.

It has been found that under certain circumstances, the increase in cooling fluid delivered to the components does not always produce the intended effect of reducing their temperatures. Therefore, according to an embodiment of the invention, at step 314, the temperatures of the components may be received at a second time (ti+1). The panel controller 204 may determine whether the increase in cooling fluid delivery to the components (step 312) resulted in a decrease in the component temperatures. Thus, at step 316, the panel controller 204 may compare the Tcomp(ti+1) with the Tcomp(ti) to determine whether the cooling fluid delivery increase resulted in a reduction in the temperatures of the components. If the Tcomp at (ti+1) is less than the Tcomp at (ti), a first scheme (scheme 1) may be invoked by the panel controller 204. According to the first scheme, when the temperatures of the components exceed a predetermined maximum set point temperature, cooling fluid delivery is increased to the components (steps 304–312).

If the temperatures of the components have risen, e.g., Tcomp(ti+1)>Tcomp(ti), the panel controller 204 may decrease the cooling fluid delivery to the components at step 318. In one respect, the rise in component temperatures could indicate that the heated air is circulating with the cooling fluid at a level to cause the cooling fluid temperature to be greater than the Tcomp(ti). In this case, a second scheme (scheme 2) may be invoked as indicated at step 320, which will be described in greater detail hereinbelow.

If the Tcomp(ti) is not greater than the Tmax,set (step 310), which equates to the Tcomp(ti) being less than the Tmin,set, the cooling fluid delivered to the components may be decreased at step 322. Thus, if an angled panel 206 is located on a front of the rack 10, the cooling fluid delivered to the components may be decreased by manipulating the angled panel 206 to decrease the mass flow rate of cooling fluid supplied into the rack 10. Alternatively, if an angled panel is provided on the rear of the rack 10, the angled panel may be manipulated to reduce the flow of heated air therethrough to generally reduce the flow of cooling fluid into the rack 10. If angled panels 20 are provided on both the front and the rear of the rack 10, they may both be manipulated to decrease the airflow through the rack 10.

At step 324, the temperatures of the components may be received at a second time (ti+1). The panel controller 204 may determine whether the decrease in cooling fluid delivery to the components (step 322) resulted in an increase in the component temperatures. Thus, at step 326, the panel controller 204 may compare the Tcomp(ti+1) to determine whether the cooling fluid delivery increase resulted in an increase in the temperatures of the components. If the Tcomp at (ti+1) is greater than the Tcomp at (ti), a first scheme (scheme 1) may be invoked by the panel controller 204. According to the first scheme, when the temperatures of the components fall below a predetermined minimum set point temperature, cooling fluid delivery to the components is decreased (steps 304–310 and 322).

If the temperatures of the components have been reduced, e.g., Tcomp(ti+1)<Tcomp(ti), the panel controller 204 may increase the cooling fluid delivery to the components at step 328. In this case, again, the second scheme (scheme 2) may be invoked as indicated at step 320.

In general, according to the second scheme, the panel controller 204 operates in a substantially opposite manner to that of the first scheme. That is, for example, under the second scheme, the panel controller 204 may decrease the cooling fluid delivery to the components in response to the temperatures of the components exceeding the predetermined maximum set point temperature. In addition, the panel controller 204 may increase the cooling fluid delivery to the components in response to the temperatures of the component falling below the predetermined minimum set point temperature.

With reference now to FIG. 7B, the panel controller 204 may initiate the timer at step 330. At step 332, the panel controller 204 may receive the temperatures of the components at some time (ti). This is denoted as Tcomp(ti) in FIG. 5B. The panel controller 204 may determine whether the Tcomp received at the first time (ti) is within their predetermined ranges at step 334. For those components 34 having Tcomp's outside their predetermined operating ranges, it is determined whether the Tcomp's are above the Tmax,set for the components 34 at step 336.

If the Tcomp's are above the Tmax,set, then the cooling fluid delivered to those components 34 is decreased at step 338 in a manner as described hereinabove. At step 340, the temperatures of the components may be received at a second time (ti+1). The panel controller 204 may determine whether the decrease in cooling fluid delivery to the components (step 338) resulted in a decrease in the component temperatures. Thus, at step 342, the panel controller 204 may compare the Tcomp(ti+1) and the Tcomp(ti) to determine whether the cooling fluid delivery decrease resulted in a reduction in the temperatures of the components. If there was a reduction in component temperatures, e.g., Tcomp(ti+1) is less than the Tcomp(ti), the second scheme (scheme 2) may be repeated by the panel controller 204. According to the second scheme, when the temperatures of the components exceed the predetermined maximum set point temperature, cooling fluid delivery is decreased to the components (steps 330–338).

If the temperatures of the components have risen, e.g., Tcomp(ti+1)>Tcomp(ti), the panel controller 204 may increase the cooling fluid delivery to the components at step 344. In this case, the first scheme (scheme 1) may be invoked as indicated at step 346, as described hereinabove. Thus, the panel controller 204 may enter an idle state indicated as step 302. Alternatively, the panel controller 204 may repeat steps 304–346 on a substantially continuous basis to bring the component temperatures within predetermined operating ranges. According to an embodiment of the invention, the panel controller 204 may prevent the angled panels from closing beyond a certain point to thus prevent a situation where the flow of cooling fluid through the rack 10 falls below a preset minimum. In other words, the panel controller 204 may stop the operational mode 200 at a certain point if it determines that the continued reduction in airflow through the rack 10 may result in damage to the components.

If the Tcomp(ti) is not greater than the Tmax,set (step 236), which equates to the Tcomp(ti) being less than the Tmin,set, the cooling fluid delivered to the components 34 may be increased at step 348. At step 350, the temperatures of the components may be received at a second time (ti+1). The panel controller 204 may determine whether the increase in cooling fluid delivery to the components (step 348) resulted in an increase in the component temperatures. Thus, at step 352, the panel controller 204 may compare the Tcomp(ti+1) with the Tcomp(ti) to determine whether the cooling fluid delivery increase resulted in an increase in the temperatures of the components. If there was an increase in component temperatures, e.g., Tcomp(ti+1) exceeds Tcomp (ti), the second scheme (scheme 2) may be repeated by the panel controller 204.

If the temperatures of the components have been decreased, e.g., Tcomp(ti+1)<Tcomp(ti), the panel controller 204 may decrease the cooling fluid delivery to the components at step 354. In this case, again, the first scheme (scheme 1) may be invoked as indicated at step 346.

The first and second schemes may be repeated any number times, e.g., as long as the components 34 are operational, at predetermined time intervals, etc. Thus, the panel controller 204 may vary the cooling fluid delivery into the rack 10 and/or heated air exhaust from the rack 10 as conditions change in the rack 10. In addition, the panel controller 204 may vary the airflow through the rack 10 according to an iterative process. That is, the panel controller 204 may alter the airflow by a predetermined amount each time a change is warranted and repeat this process until the Tcomp's are within the predetermined operating temperature ranges.

In addition, where the panel assembly 202 contains more than one independently controllable angled panel 206, e.g., a pair of angled panels 206 spaced vertically apart from one another, the airflow through each of the angled panels 206 may be operated in substantially independent manners. Thus, for example, if a component located in an upper portion of the rack has a Tcomp exceeding a Tmax,set and a component located in a lower portion of the rack has a Tcomp below a Tmin,set, the angled panel 206 that controls airflow to the upper portion of the rack may be manipulated to increase the airflow therethrough and the angled panel 206 that controls airflow to the lower portion of the rack may be manipulated to decrease the airflow therethrough. In this respect, the cooling fluid may be supplied in substantially independent manners to various portions of the rack. In addition, the supply of cooling fluid may be varied according to the amount of heat generated by the components in the various portions of the rack.

In one regard, by controlling the cooling fluid delivery to the components on an essentially "as-needed" basis, the amount of energy required to operate the components in the rack may be substantially optimized. In another regard, by generally limiting the cooling fluid flow through the rack, the temperature of the heated air returning to an air conditioning unit may be maintained at a relatively high temperature, thus increasing the air conditioning unit's efficiency.

Figure 8:
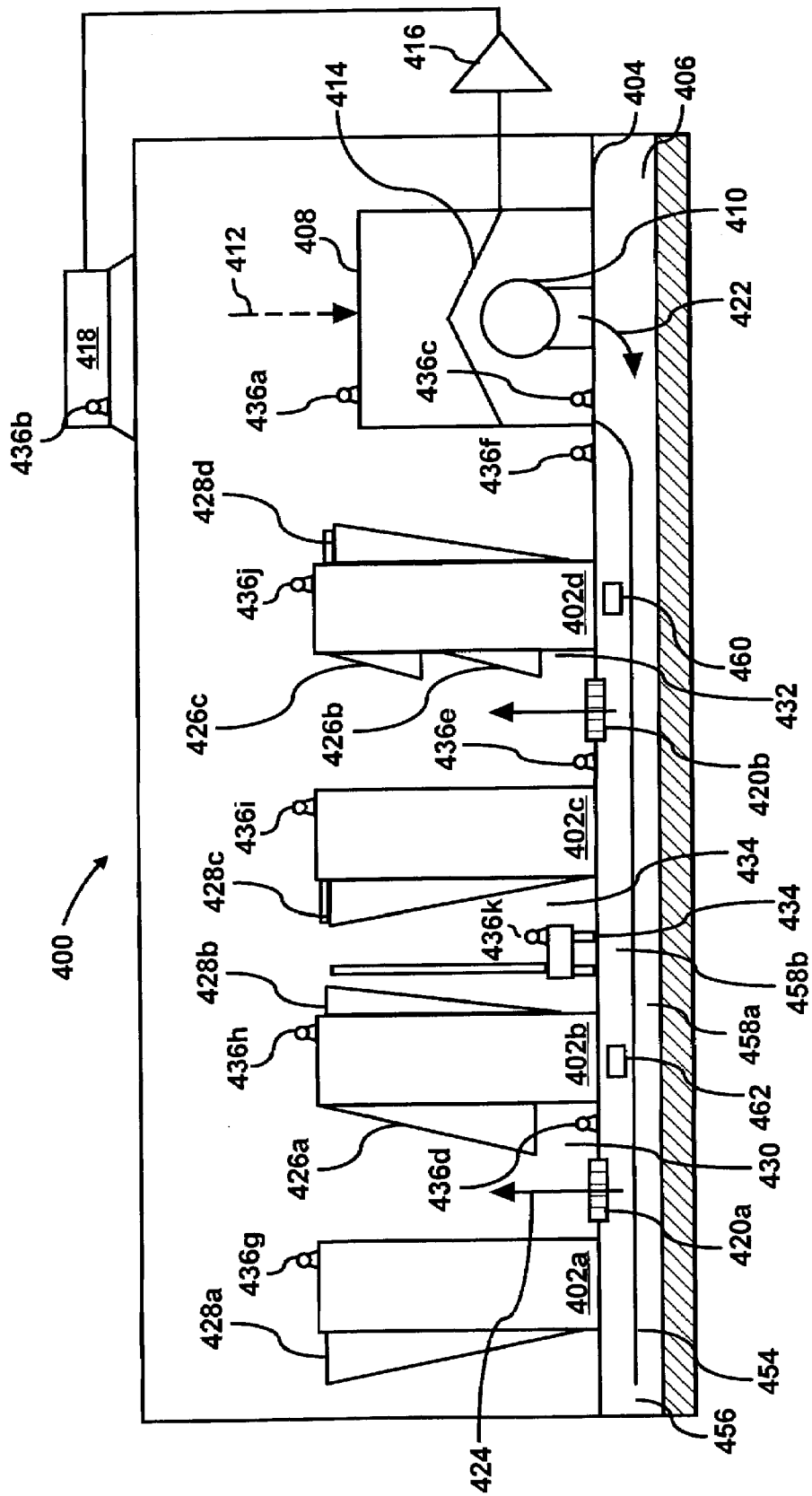
FIG. 8 is a simplified schematic illustration of a data center containing a plurality of racks having one or more angled panels, according to an embodiment of the invention.

FIG. 8 is a simplified schematic illustration of a data center 400 containing a plurality of racks 402a–402d having one or more angled panels, e.g., angled panels 20, 102, 120a, 120b, and 122, according to an embodiment of the invention. The use of the terms "data center" throughout the present disclosure are generally meant to denote a room or other space where one or more heat generating components may be situated. In this respect, the terms "data center" are not meant to limit the invention to any specific type of room where data is communicated nor should it be construed that use of the terms "data center" limits the invention in any respect other than its definition hereinabove.

It should be readily apparent to those of ordinary skill in the art that the data center 400 depicted in FIG. 8 represents a generalized illustration and that other components may be added or existing components may be removed or modified without departing from the scope of the invention. For example, the data center 400 may include any number of racks and various other components.

The data center 400 includes a raised floor 404. A plurality of wires and communication lines (not shown) may be located in a space 406 beneath the raised floor 404. In addition, the space 406 may function as a plenum to deliver cooling fluid from an air conditioning unit 408 to the plurality of racks 402a–402d. Although the data center 400 is illustrated as containing four racks 402a–402d and an air conditioning unit 408, it should be understood that the data center 400 may include any number of racks, e.g., 100 racks, and air conditioning units, e.g., four or more. The depiction of four racks 402a–402d and an air conditioning unit 408 is for illustrative and simplicity of description purposes only and is not intended to limit the invention.

The racks 402a–402d generally house a plurality of heat generating components (not shown), e.g., processors, microcontrollers, high speed video cards, memories, semi-conductor devices, and the like. The components may be elements of a plurality of subsystems (not shown), e.g., computers, servers, etc. The subsystems and the components may be implemented to perform various electronic, e.g., computing, switching, routing, displaying, and the like, functions. Therefore, the subsystems and components may comprise the components 34 described hereinabove. In the performance of these electronic functions, the components, and therefore the subsystems, may generally dissipate relatively large amounts of heat. Because the racks 402a–402d have been generally known to include upwards of forty (40) or more subsystems, they may transfer substantially large amounts of heat to the cooling fluid to maintain the subsystems and the components generally within predetermined operating temperature ranges.

The air conditioning unit 408 includes a fan 410 for supplying cooling fluid (e.g., air) into the space 406 (e.g., plenum) and/or drawing air from the data center 400 (e.g., as indicated by the arrow 412). In operation, the heated air enters into the air conditioning unit 408 as indicated by the arrow 412 and is cooled by operation of a cooling coil 414, a compressor 416, and a condenser 418, in a manner generally known to those of ordinary skill in the art. In terms of cooling system efficiency, it is generally desirable that the return air is composed of the relatively warmest portion of air in the data center 400.

Although reference is made throughout the present disclosure of the use of a fan 410 to draw heated air from the data center 400, it should be understood that any other reasonably suitable manner of air removal may be implemented without departing from the scope of the invention. By way of example, a fan (not shown) separate from the fan 410 or a blower may be utilized to draw air from the data center 400.

In addition, based upon the cooling fluid needed to cool the heat loads in the racks 402a–402d, the air conditioning unit 408 may be operated at various levels. For example, the capacity (e.g., the amount of work exerted on the refrigerant) of the compressor 416 and/or the speed of the fan 410 may be modified to thereby control the temperature and the amount of cooling fluid flow delivered to the racks 402a–402d. In this respect, the compressor 416 may comprise a variable capacity compressor and the fan 410 may comprise a variable speed fan. The compressor 416 may thus be controlled to either increase or decrease the mass flow rate of a refrigerant therethrough. Because the specific type of compressor 416 and fan 410 to be employed with embodiments of the invention may vary according to individual needs, the invention is not limited to any specific type of compressor or fan. Instead, any reasonably suitable type of compressor 416 and fan 410 that are capable of accomplishing certain aspects of the invention may be employed with the embodiments of the invention. The choice of compressor 416 and fan 410 may depend upon a plurality of factors, e.g., cooling requirements, costs, operating expenses, etc.

It should be understood by one of ordinary skill in the art that embodiments of the invention may be operated with constant speed compressors and/or constant speed fans. In one respect, control of cooling fluid delivery to the racks 402a–402d may be effected based upon the pressure of the cooling fluid in the space 406. According to this embodiment, the pressure within the space 406 may be controlled through operation of, for example, a plurality of vents 420a and 420b positioned at various locations in the data center 400. That is, the pressure within the space 406 may be kept essentially constant throughout the space 406 by selectively controlling the output of cooling fluid through the vents 420a and 420b. By way of example, if the pressure of the cooling fluid in one location of the space 406 exceeds a predetermined level, a vent located substantially near that location may be caused to enable greater cooling fluid flow therethrough to thereby decrease the pressure in that location. A more detailed description of this embodiment may be found in U.S. application Ser. No. 10/303,761, filed on Nov. 26, 2002 and U.S. application Ser. No. 10/351,427, filed on Jan. 27, 2003, which are assigned to the assignee of the present invention and are hereby incorporated by reference in their entireties.

In addition, or as an alternative to the compressor 416, a heat exchanger (not shown) may be implemented in the air conditioning unit 408 to cool the fluid supply. The heat exchanger may comprise a chilled water heat exchanger, a centrifugal chiller (e.g., a chiller manufactured by YORK), and the like, that generally operates to cool air as it passes over the heat exchanger. The heat exchanger may comprise a plurality of air conditioners. The air conditioners may be supplied with water driven by a pump and cooled by a condenser or a cooling tower. The heat exchanger capacity may be varied based upon heat dissipation demands. Thus, the heat exchanger capacity may be decreased where, for example, it is unnecessary to maintain the cooling fluid at a relatively low temperature.

In operation, cooling fluid generally flows from the fan 410 into the space 406 as indicated by the arrow 422. The cooling fluid flows out of the raised floor 404 and into various areas of the racks 402a–402d through the plurality of dynamically controllable vents 420a and 420b as indicated by the arrows 424. The vents 420a and 420b are termed "dynamically controllable" because they generally operate to control at least one of velocity, volume flow rate and direction of the cooling fluid therethrough. A more detailed description of the dynamically controllable vents 420a and 420b may be found in co-pending U.S. application Ser. No. 09/970,707, filed on Oct. 5, 2001, which is assigned to the assignee of the present invention and is incorporated by reference herein in its entirety. In addition, specific examples of dynamically controllable vents 420a and 420b may be found in co-pending U.S. application Ser. No. 10/375,003, filed on Feb. 28, 2003, which is assigned to the assignee of the present invention and is incorporated by reference herein in its entirety.

As the cooling fluid flows out of the vents 420a and 420b, the cooling fluid may flow into the racks 402a–402d. The racks 402a–402d generally include inlets to receive the cooling fluid from the vents 420a and 420b. In FIG. 8, the racks 402a and 402c generally comprise one or more openings to enable the cooling fluid to enter the racks 402a and 402c. In addition, an angled panel 426a is provided at the inlet of the rack 402b and angled panels 426b and 426c are located at the inlet of the rack 402d. As described hereinabove, the angled panels 426a–426c may be configured to control the cooling fluid delivered to racks 402b and 402d. In addition, as also described hereinabove, the angled panels 426a–426c may either be substantially rigidly or rotatably attached to the racks 402b and 402d.

In addition, various sections of the racks 402b and 402d may receive substantially individualized amounts of cooling fluid. By way of example, if the bottom half of the rack 402d is operating at maximum power, thereby dissipating a maximum level of heat load, and the upper half is operating at little or no power, the vent 420b may be configured to enable cooling fluid flow therethrough to have a relatively high volume flow rate with a relatively low velocity. In this manner, the cooling fluid may operate to generally supply greater cooling to the lower half of the rack 402d, whereas the upper half may receive relatively lesser amounts of cooling fluid.

In addition, or in the alternative, the angled panel 426b may be manipulated, e.g., the angle between the angled panel 426b and the rack 402d may be increased, to increase cooling fluid flow therethrough. Also, the angled panel 426c may be manipulated, e.g., the angle between the angled panel 426c and the rack 402d may be decreased, to decrease cooling fluid flow therethrough. In addition, if the angled panels 426b and 426c include fans (not shown), the fans may be operated to either increase or decrease the flow of cooling fluid therethrough. Moreover, the angled panels 426b and 426c and the fans may be manipulated substantially simultaneously to vary the flow of cooling fluid into the rack 402d.

As the cooling fluid flows through the racks 402a–402d, the cooling fluid may become heated by absorbing heat dissipated from components located in the racks 402a–402d. The heated air may generally exit the racks 402a–402d through one or more outlets located on a rear of the racks 402a–402d. As shown in FIG. 8, the rack 402a includes an angled panel 428a, the rack 402b includes an angled panel 428b, the rack 402c includes an angled panel 428c, and the rack 402d includes an angled panel 428c. Although angled panels 428a–428d are illustrated as being respectively attached to the racks 402a–402d, one or more of the racks 402a–402d may be configured without the angled panels 428a–428d without departing from the scope of the invention.

As described hereinabove, the angled panels 428a–428d may be configured to control the cooling fluid flow through the racks 402a–402d by controlling the heated air exhaust out of the racks 402a–402d. In addition, as also described hereinabove, the angled panels 428a–428d may either be substantially rigidly or rotatably attached to the racks 402a–402d. In the event that the angled panels 428a–428d are rotatably attached to the racks 402a–402d, their angles may be controlled by one or more panel controllers, e.g., panel controller 204 (FIG. 4). By way of example, the angled panels 428a–428d may be manipulated based upon the temperatures of the air at the inlets and the outlets of the racks 402a–402d. In addition, the angled panels 428a–428d may be manipulated in response to the temperatures of the components contained in the racks 402a–402d.

According to an embodiment of the invention, the angled panels 428a–428d may be manipulated to control the flow of air through the racks 402a–402d in a manner to generally reduce re-circulation of heated air and cooling fluid. In one respect, re-circulation may be reduced by controlling the magnitude of the airflow. In another respect, the angled panels 428a–428d may be manipulated to vary the direction of heated air exhausting from the racks 402a–402d. That is, the direction of the heated airflow may be manipulated to flow away from an inlet of a neighboring rack. The heated airflow may be directed in a generally upward direction to substantially minimize re-circulation of the heated air with cooling fluid entering the racks 402a–402d. Thus, the temperature of the cooling fluid entering the racks 402a–402d may substantially equal the temperature of the cooling fluid exiting the vents 420a and 420b.

Moreover, as the cooling requirements vary according to the heat loads in the racks 402a–402d, along with the subsequent variations in the volume flow rate of the cooling fluid, the air conditioning unit 408 may also vary the amount of cooling fluid supplied to the racks 402a–402d. As an example, if the heat loads in the racks 402a–402d generally increases, the air conditioning unit 408 may operate to increase one or more of the supply and temperature of the cooling fluid. Alternatively, if the heat loads in the racks 402a–402d generally decreases, the air conditioning unit 408 may operate to decrease one or more of the supply and temperature of the cooling fluid. In this regard, the amount of energy utilized by the air conditioning unit 408 to generally maintain the components in the data center 400 within predetermined operating temperatures may substantially be optimized.

The vents 420a and 420b and the angled vents thus generally provide localized or zonal control of the cooling fluid flow to the racks 402a–402d. Whereas, the air conditioning unit 408 generally provides global control of the cooling fluid flow. By virtue of the zonal and global control of the cooling fluid, the amount of energy consumed by the air conditioning unit 408 in maintaining the components of the racks 402a–402d within predetermined operating temperature ranges may substantially be reduced in comparison with conventional data center cooling systems.

As shown in FIG. 8, the areas between the racks 402a–402d may comprise cool aisles 430 and 430 or hot aisles 432. The cool aisles 430 are those aisles that include the vents 420a and 420c and thus receive cooling fluid for delivery to the racks 402a–402d. The hot aisles 432 are those aisles that receive air heated by the components in the racks 402a–402d. By substantially separating the cool aisles 430 and the hot aisles 432, the cooling fluid may substantially be prevented from re-circulating with the heated air prior to being delivered into the racks 402a–402d.

FIG. 8 also shows a plurality of location aware devices 436a–436j located throughout the data center 400. Thus, for example, the locations of the racks 402a–402d may be determined with respect to the vents 420a and 420b. In addition, the location aware devices 436a–436j are configured to communicate with each other. By way of example, temperature information from the racks 402a–402d may be communicated to the vents 420a and 420b. The vents 420a and 420b may be operated to deliver cooling fluid to the racks 402a–402d substantially as needed based upon the received temperature information.

According to another embodiment of the invention, a mobile device 438 may be provided to gather or measure at least one environmental condition (e.g., temperature, pressure, air flow, humidity, location, etc.) in the data center 400. More particularly, the mobile device 438 may be configured to travel around the racks 402a–402d to determine the one or more environmental conditions at various locations throughout the data center 400. A more detailed description of the mobile device 438 and its operability may be found in co-pending U.S. application Ser. No. 10/157,892, filed on May 31, 2002, which is assigned to the assignee of the present invention and is hereby incorporated by reference in its entirety.

As described in the Ser. No. 10/157,892 application, the mobile device 438 may be a self-propelled mechanism configured for motivation around the racks 402a–402d of the data center 400. In addition, the mobile device 438 includes a plurality of sensors configured to detect one or more environmental conditions at various heights. The mobile device 438 may transmit the environmental condition information to an air conditioning unit controller (not shown) which may utilize the information in determining delivery of cooling fluid to the racks 402a–402d in the data center 400. In addition, the mobile device 438 may transmit the environmental condition information to vent controllers (not shown) configured to operate the vents 420a and 420b. Moreover, the mobile device 438 may transmit the environmental condition information to one o more panel controllers. Thus, for example, the mobile device 438 may detect the temperatures of the exhaust air from the racks 402a–402d and transmit that information to the panel controller(s) of the racks 402a–402d.

The panel controller(s) of the racks 402a–402d may use the received environmental condition information from the mobile device 438 to control the flow of cooling fluid or heated air through the racks 402a–402d.

According to another embodiment, the mobile device 438 may receive environmental information from location aware device(s), e.g., location aware devices 436a–436j. For example, the location aware device(s) may transmit a temperature measurement to the mobile device 438 indicating a hot spot, e.g., a location where the temperature is substantially above normal. The mobile device 438 may alter its course to travel to the detected hot spot to verify the temperature measurement by the location aware device(s).

Figure 9A:
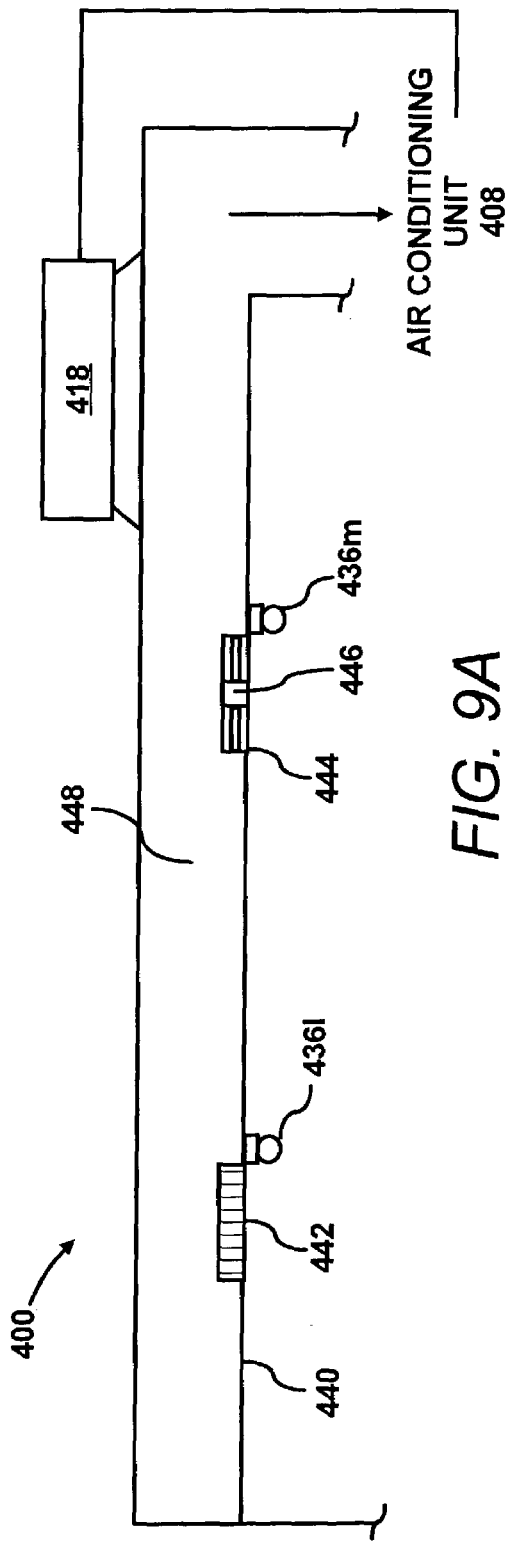
FIGS. 9A and 9B are cross-sectional side views of an upper portion of a data center according to embodiments of the invention.
Figure 9B:
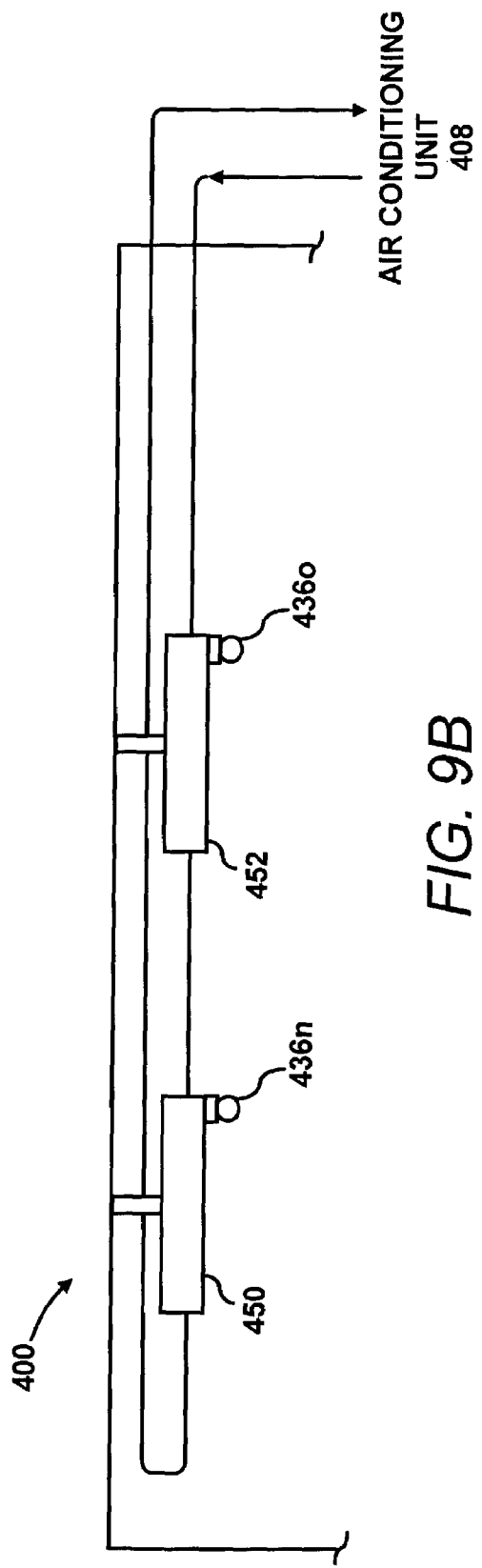

FIGS. 9A and 9B are cross-sectional side views of an upper portion of a data center 400 according to embodiments of the invention. It should be readily apparent to those of ordinary skill in the art that the embodiments depicted in FIGS. 9A and 9B represent generalized illustrations and that other components may be added or existing components may be removed or modified without departing from the scope of the invention.

With reference first to FIG. 9A, the data center 400 may include a lowered ceiling 440. Dynamically controllable returns 442 and 444 may be situated along the lowered ceiling 440 to generally enable controlled removal of heated air from the data center 400. To facilitate removal of air from the data center 400, the returns 442 and 444 may include a fan 446. A more detailed description of the returns 442 and 444 and manners of their operability may be found in co-pending U.S. application Ser. No. 10/262,879, filed on Oct. 3, 2002, which is assigned to the assignee of the present invention and is hereby incorporated by reference in its entirety.

As described in the Ser. No. 10/262,879 application, a space 448 between the lowered ceiling 440 and the ceiling of the data center 400 may function as a plenum through which air may be returned to the air conditioning unit 408. Through implementation of the dynamically controllable returns 442 and 444, the removal of heated air from the racks 402a–402d may be substantially controlled to minimize mixing of the heated air with the cooling fluid. For example, the returns 442 and 444 may operate to remove greater amounts of heated air when the temperature of the air in their vicinities rises above a predetermined level.

In addition, the returns 442 and 444 may be positioned substantially above the angled panels 428a–428d. In this regard, the angled panels 428a–428d may be configured to direct heated airflow in the general direction of the returns 442 and 444. Alternatively, the angled panels 428a–428d may be manipulated to direct the heated airflow to travel in the general direction of the returns 442 and 444. The returns 442 and 444 may thus remove the heated air from the racks 402a–402d in a relatively effective manner.

Location aware devices 436l and 436m may be positioned in the vicinities of the returns 404 and 406. In this regard, their locations with respect to the returns 442 and 444 may be tracked without requiring substantial manual input. In addition, through communication between the location aware devices 436a–436m, the returns 442 and 444 and the racks 402a–402d may be controlled to enable efficient cooling operations, both in terms of energy efficiency and reduction of re-circulation between the cooling fluid and heated air. Moreover, if there is a change in the data center 400 configuration, the angled panels 428a–428d may be manipulated to deliver heated air to the returns 442 and 444 in a manner to generally reduce re-circulation of the heated air with the cooling fluid. For example, the angles of the angled panels 428a–428d may be varied to enable a more direct delivery of the heated air to the returns 442 and 444.

With reference now to FIG. 9B, heat exchanger units ("HEU") 450 and 452 may be provided in the data center 400. The HEU's 450 and 452 are disclosed and described in co-pending U.S. application Ser. No. 10/210,040, filed on Aug. 2, 2002, which is assigned to the assignee of the present invention and is hereby incorporated by reference in its entirety. As described in the Ser. No. 10/210,040 application, the HEU's 450 and 452 generally operate to receive heated air from the racks 402a–402d, cool the received air, and deliver the cooled air back to the racks 402a–402d in a substantially controlled manner.

According to an embodiment of the invention, the angled panels 436a–436c may be substantially flipped along the horizontal axis from that which is shown in FIG. 8. That is, the inlets to the angled panels 436a–436c may be positioned to receive cooling fluid from the HEU's 450 and 452. In addition, the angled panels 438a–438d may be positioned substantially beneath the inlets of the HEU's 450 and 452. Alternatively, the angled panels 428a–428d may be manipulated to direct the heated airflow to travel in the general direction of the HEU's 450 and 452.

Location aware devices 436n and 436o may be positioned in the vicinities of the HEU's 450 and 452. In this regard, the locations of the HEU's 450 and 452 with respect to, for example, the racks 402a–402d may be tracked without requiring substantial manual input. In addition, if there is a change in the data center 400 configuration, the angled panels 426a–426c may be manipulated to receive cooling fluid from the HEU's 450 and 452 in a manner to generally reduce re-circulation of the cooling fluid with the heated air. Moreover, the angled panels 428a–428d may be manipulated to deliver heated air to the HEU's 450 and 452 in a manner to generally reduce re-circulation of the heated air with the cooling fluid.

With reference again to FIG. 8, according to an embodiment of the present invention, the cooling fluid supply for flow through the vents 420a and 420b may be maintained at a relatively uniform pressure. In this respect, the space 406 may include a divider 454. The divider 454 may extend substantially along the entire length of space 406, i.e., in the direction generally perpendicular to the plane of FIG. 8. The divider 454 may also extend from the air conditioning unit 408 to substantially the end of the space 406 to thus create a gap 456 between a side edge of the divider 454 and a side surface of the space 406. The divider 454 generally divides the space 406 into two relatively separate chambers 458a and 458b. The first chamber 458a is in fluid communication with the outlet of the fan 410. The second chamber 458b is in fluid communication with the first chamber 458a substantially through the gap 456. In this respect, the cooling fluid flow originating from the fan 410 must travel substantially the entire width of the space 406, i.e., through the first chamber 458a, for the fluid flow to enter into the second chamber 458b.

The cooling fluid in the second chamber 458b may be maintained at a substantially uniform static pressure by virtue of the manner in which the cooling fluid is introduced into the second chamber 458b. The rate at which the cooling fluid is supplied into the first chamber 458a by the fan 410 may cause a relatively large amount of turbulence in the cooling fluid located in the first chamber 458a. The turbulence is generally greatest at the outlet of the fan 410 and generally decreases as the distance from the outlet increases. By virtue of the distance the cooling fluid must travel to enter into the second chamber 458b, the cooling fluid may have substantially stabilized, thus enabling the cooling fluid entering into the second chamber 458b to be relatively calm. In this respect, the divider 454 generally operates to provide a relatively consistent cooling fluid pressure supply for the vents 420a and 420b.

A pressure sensor 460, e.g., a location aware device, may measure the pressure of the cooling fluid located in the second chamber 458b. In this respect, the pressure sensor 460 may detect discernable changes in the pressure of the cooling fluid located within the second chamber 458b and relay that information to a cooling system controller (not shown) and/or to other location aware devices 436a–436o. The cooling system controller may operate to alter the output of the fan 410 in response to the detected changes in pressure. Therefore, operation of the fan 410 may be related to the cooling requirements of the racks 402a–402d and the amount of energy required to supply the racks 402a–402d with cooling fluid may be substantially optimized. In one respect, only that amount of energy required to substantially cool the components contained in the racks 402a–402d may be expended, which may correlate to a substantial energy savings over known cooling systems.

In addition, the vents 420a and 420b may receive information from a temperature sensor 462 and the pressure sensor 460. The vents 420a and 420c may use this information in controlling the flow of cooling fluid therethrough.

Figure 10:
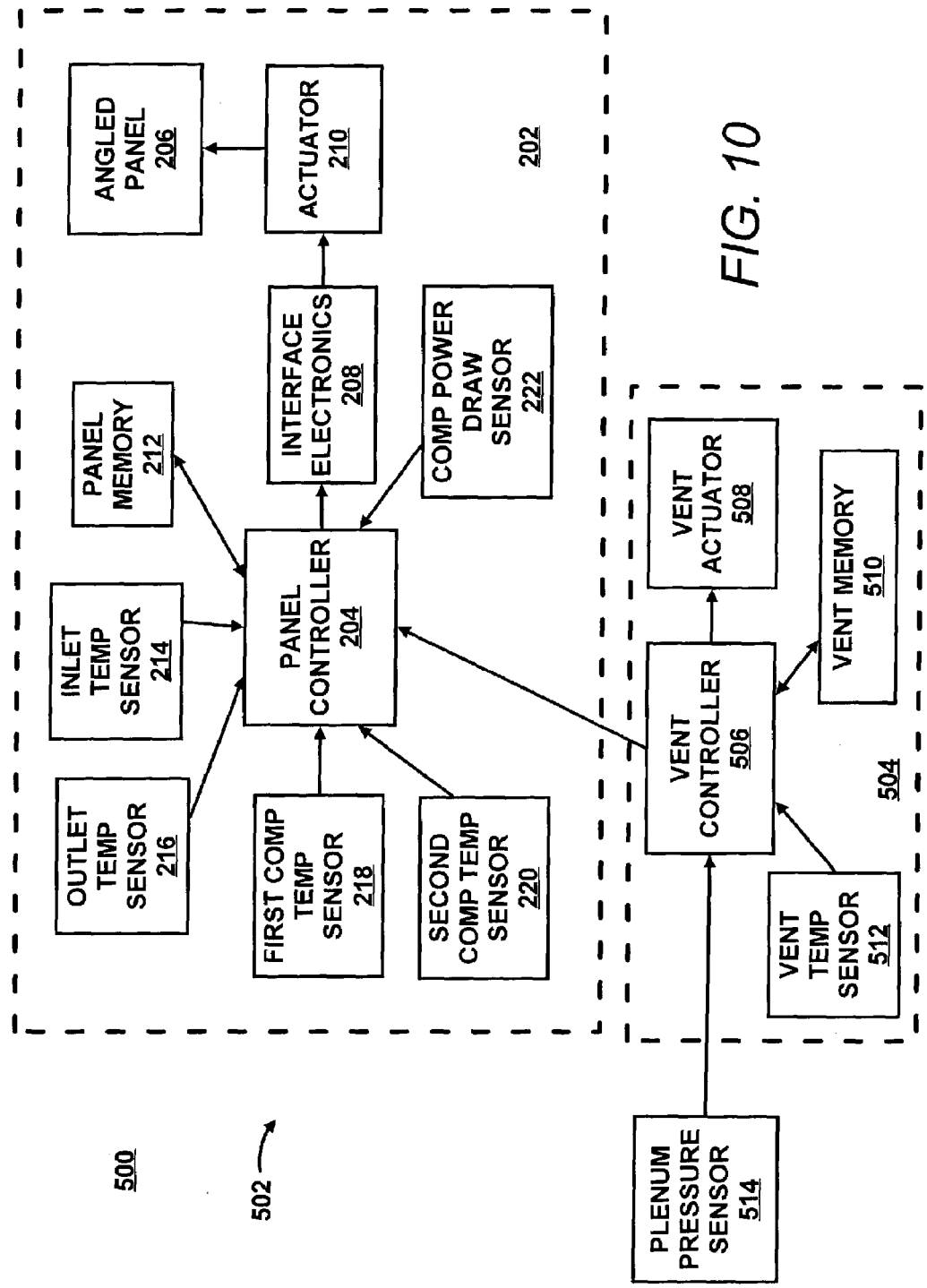
FIG. 10 is an exemplary block diagram for a cooling system according to an embodiment of the invention.

FIG. 10 is an exemplary block diagram 500 for a cooling system 502 according to an embodiment of the invention. It should be understood that the following description of the block diagram 500 is but one manner of a variety of different manners in which such a cooling system 502 may be operated. In addition, it should be understood that the cooling system 502 may include additional components and that some of the components described may be removed and/or modified without departing from the scope of the invention.

The cooling system 502 comprises a panel system 202 (FIG. 6) and a vent system 504. A detailed description of the panel system 202 will not be set forth below. Instead, the disclosure hereinabove with respect to the panel system 202 is relied upon to provide an adequate understanding of this system.

The vent system 504 includes a vent controller 506 configured to control the operations of a vent. For example, the vent controller 506 may operate a vent actuator 508 to vary at least one of cooling fluid direction and volume flow rate through the vent. The vent may comprise the dynamically controllable vent, e.g., vents 420a and 420b (FIG. 8). The vent controller 506 may comprise a microprocessor, a micro-controller, an application specific integrated circuit (ASIC), and the like.

The vent controller 506 may be interfaced with a vent memory 510 configured to provide storage of a computer software that provides the functionality of the vent system 504 and may be executed by the vent controller 506. The vent memory 510 may be implemented as a combination of volatile and non-volatile memory, such as DRAM, EEPROM, flash memory, and the like. The vent memory 510 may also be configured to provide a storage for containing data/information pertaining to the manner in which the vent actuator 508 may be manipulated in response to, for example, variations in the temperature of the cooling fluid and/or pressure within the plenum, e.g., space 406 (FIG. 8).

The vent controller 506 may receive temperature information from a vent temperature sensor 512. The vent temperature sensor 512 maybe positioned to detect the temperature of the cooling fluid flowing through the vent. In addition, the vent controller 506 may receive information pertaining to the pressure of the cooling fluid in the plenum from a plenum pressure sensor 514, e.g., pressure sensor 460.

Communications between the vent controller 506 and the vent actuator 508, temperature sensor 512, and the plenum pressure sensor 514 may be effectuated through a wired protocol, such as IEEE 802.3, etc., wireless protocols, such as IEEE 801.11b, 801.11g, wireless serial connection, Bluetooth, etc., or combinations thereof. In addition, some or all of the communications may be effectuated through implementation of the location aware devices disclosed and described hereinabove.

The vent controller 506 may also be configured to communicate data/information with the panel controller 204. The communicated data/information may pertain to the pressure of the cooling fluid in the plenum, the temperature of the cooling fluid flowing through the vent, the volume flow rate of the cooling fluid flowing through the vent, and the direction of cooling fluid flow.

A network adapter (not shown) may be provided as an interface between the vent controller 506 and the panel controller 204. In this regard, the network adapter may enable communication via a wired protocol, such as IEEE 802.3, etc., wireless protocols, such as IEEE 801.11b, wireless serial connection, Bluetooth, etc., or combinations thereof. In addition, location aware devices may be implemented to enable wireless communications between the vent controller 506 and the panel controller 204.

FIGS. 11A–11D, collectively, show an exemplary flow diagram of an operational mode 600 according to an embodiment of the invention. It should be understood that the operational mode 600 may include additional operations and that some of the operations may be removed and/or modified without departing from the scope of the invention. The following description of the operational mode 600 is made with reference to the block diagram 500 illustrated in FIG. 10, and thus makes reference to the elements cited therein.

The operations illustrated in the operational mode 600 may be contained as a utility, program, or a subprogram, in any desired computer accessible medium. In addition, the operational mode 600 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

The operational mode 600 may be implemented to operate a cooling system 502 to control environmental conditions within a data center, e.g., data center 300. The operational mode 600 may be initiated in response to a variety of stimuli at step 602. For example, the operational mode 600 may be initiated in response to a predetermined lapse of time, in response to receipt of a transmitted signal, and/or in response to a detected change in an environmental condition (e.g., temperature, humidity, location, etc.).

At step 604, the panel controller 204 may initiate a timer, e.g., timer 224. The panel controller 204 may receive temperature information from one or more of the components 34 (Tcomp) at a first time (ti) housed in the rack 10 at step 606. As described hereinabove, temperature sensors 218, 220 of the components may communicate directly with the panel controller 204. Alternatively, the temperature sensors 218, 220 may communicate with a rack controller (not shown) which may essentially relay the temperature information of the components to the panel controller 204.

At step 608, the panel controller 204 may receive information from the vent controller 506. This information may pertain to the pressure of the cooling fluid in the plenum, the temperature of the cooling fluid flowing through the vent, the volume flow rate of the cooling fluid flowing through the vent, and the direction of cooling fluid flow. In addition, the panel controller 204 may receive information from the rack controller 154. This information may pertain to the measured temperatures of one or more components and the power draw to the components in the rack.

At step 610, the panel controller 204 may determine the mass flow rate of airflow through the rack. The mass flow rate of the airflow may be determined based upon the following formula:

$$m_r = Q/(Cp(T_{out} - T_{in}))$$

where:
  $m_r$ is the mass flow rate through the rack;
  Q is the power draw to the components in the rack;
  Cp is the specific heat capacity;
  $T_{out}$ is the outlet temperature; and
  $T_{in}$ is the inlet temperature.

Alternatively, one or more sensors may measure the mass flow rate of airflow through the rack. The mass flow rate sensor(s) may transmit the detected airflow mass flow rate to the panel controller 204. In addition, mass flow rate sensor(s) may be positioned at an inlet and an outlet of the rack.

At step 612, the panel controller 204 may substantially concurrently with step 610, determine the mass flow rate of the cooling fluid flow through the vent ($m_v$). The $m_v$ may be defined as a function of the vent setting, e.g., the percent open of the vent based upon the vent actuator 508, and the pressure in the plenum. The mass flow rates for various plenum pressures and vent settings may be stored in the vent memory 510, for example, as a look-up table (not shown). The look-up table may include correlations between the plenum pressures, the vent settings and mass flow rates.

Thus, based upon the plenum pressure detected by the plenum pressure sensor 514 and the vent setting related to the vent actuator 508, the vent controller 506 may determine the mass flow rate of the cooling fluid flow through the vent. The vent controller 506 may communicate this information to the panel controller 204. Alternatively, the panel memory 212 may store the look-up table and the panel controller 204 may access the look-up table to determine the mass flow rate of the cooling fluid flow through the vent based upon information received from the vent controller 506.

As a further alternative, one or more sensors may measure the mass flow rate of airflow through the vent. The mass flow rate sensor(s) may transmit the detected airflow mass flow rate to the vent controller 506.

The panel controller 204 may compare the mass flow rate through the rack with the mass flow rate through the vent at step 614. In performing step 614, the panel controller 204 may utilize a conversion factor in comparing the mass flow rates of airflow through the rack and the vent. The conversion factor may be based on a plurality of factors, e.g., power supplied to the components, temperature of the components, the degree to which the angled panel is open, etc., and may be based upon a substantially optimal mass flow rate difference that reduces or eliminates re-circulation of cooling fluid with heated air. For example, the panel controller 204 may determine that based upon the plurality of factors, the substantially optimal mass flow rate difference occurs when there is twice as much airflow through the vent than the rack. This may occur, for example, when the vent supplies cooling fluid to more than one rack.

Thus, at step 616, the panel controller 204 may establish the conversion factor in comparing the mass flow rates. More particularly, the conversion factor is depicted as some number X times the mass flow rate through the rack and some number Y times the mass flow rate through the vent. In the example above, a substantially optimal difference in mass flow rates may occur when X=2 and Y=1. It should be understood that in certain situations, the substantially optimal mass flow rates may be achieved when the mass flow rates are substantially equal.

If X times the mass flow rate through the rack equals Y times the mass flow rate through the vent, steps 604–616 may be repeated. Alternatively, the panel controller 204 may enter an idle state (step 600) and may re-initiate steps 604–616 in response to the variety of stimuli described hereinabove.

If X times the mass flow rate through the rack does not equal Y times the mass flow rate through the vent, the panel controller 204 may determine whether X times the mass flow rate through the rack ($m_r$) is greater than Y times the mass flow rate through the vent ($m_v$) at step 618. If X times the mass flow rate through the rack is not greater than Y times the mass flow rate through the vent, the panel controller 204 may operate an actuator, e.g., first actuator 112, to increase the airflow through the rack, at step 622. It should be understood, based upon the disclosure above, that the actuator may operate an angled panel located on either or both of a front and a rear of the rack to increase the airflow through the rack.

If X times the mass flow rate through the rack is greater than Y times the mass flow rate through the vent, the panel controller 204 may determine whether the temperatures of the components (Tcomp) is less than a maximum set point temperature (Tmax,set) at step 620. Again, as described hereinabove, the maximum set point temperature for the various components in the rack may vary from one another. In addition, the maximum set point temperature for the various components may be stored in the panel memory 224. Alternatively, the Tmax,set may be a maximum aggregate temperature of the components in the rack. Therefore, the Tmax,set may relate to a maximum temperature of the rack.

If the temperatures of the components (Tcomp(ti)) above the maximum set point temperature, i.e., Tcomp(ti) exceeds Tmax,set, the panel controller 204 may operate the actuator to increase the airflow through the angled panel as indicated at step 622.

If the Tcomp(ti) is below Tmax,set, the panel controller 204 may operate an actuator, e.g., actuator 210, to decrease the airflow through the angled panel, at step 624. It should be understood, based upon the disclosure above, that the actuator may operate an angled panel located on either or both of a front and a rear of the rack to decrease the airflow through the rack.

Figure 11A:
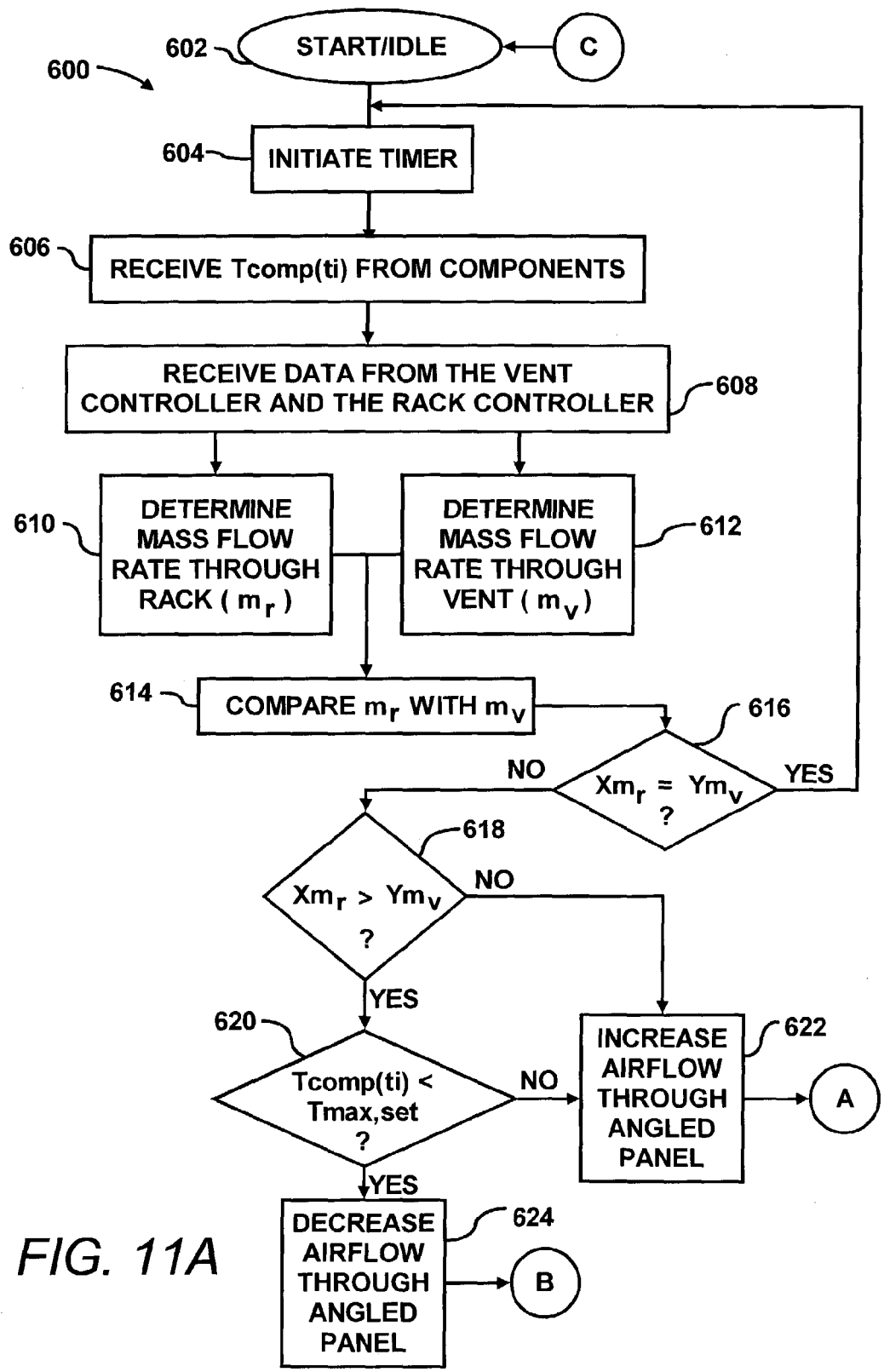
FIGS. 11A–11D, collectively, show an exemplary flow diagram of an operational mode according to an embodiment of the invention.
Figure 11B:
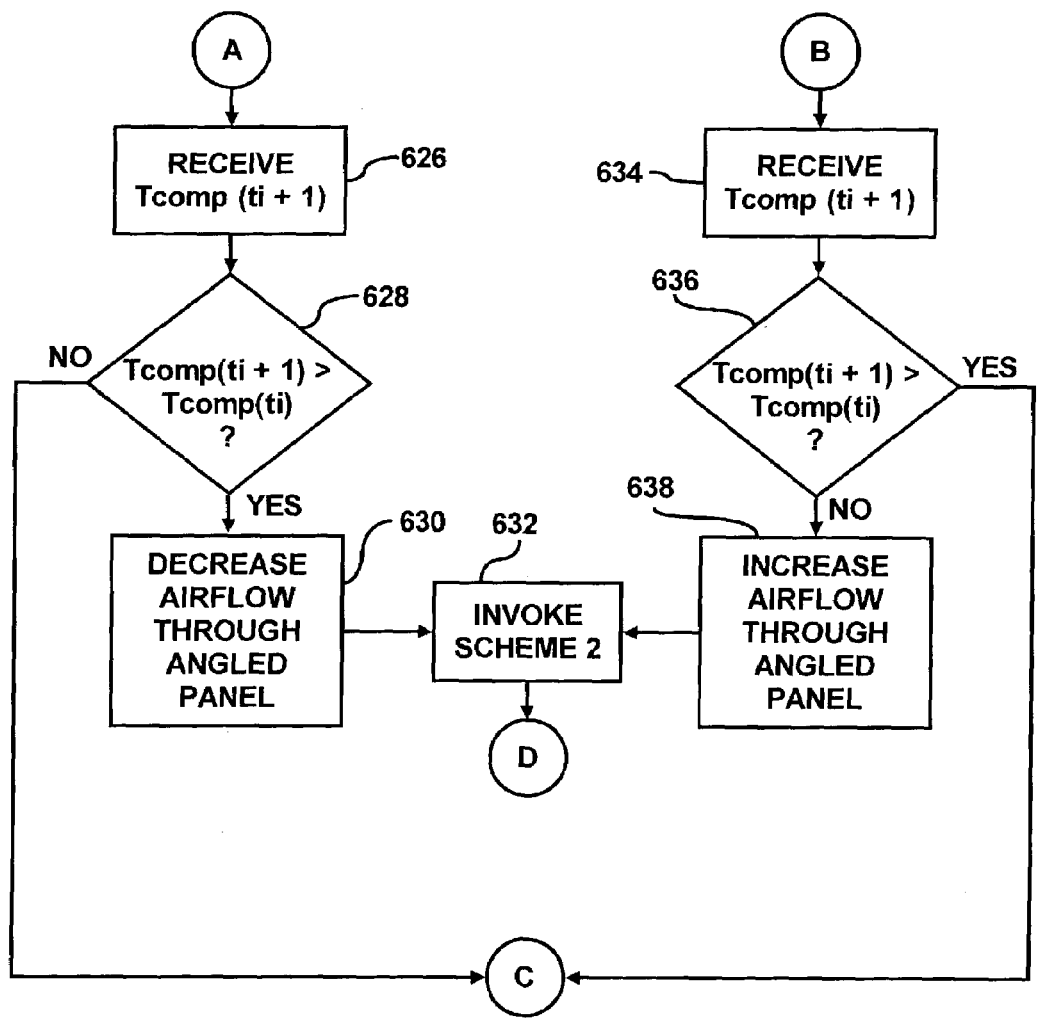

As described above, there may be situations where the increase in airflow delivered to the components, e.g., through manipulation of the angled panel, does not always produce the intended change in component temperatures. Therefore, according to an embodiment of the invention, following step 622, the temperatures of the components may be received at a second time (ti+1) at step 626 (FIG. 11B). The panel controller 204 may determine whether the increase in airflow through the angled panel resulted in a decrease in the component temperatures at step 628. This determination may be made by comparing Tcomp(ti+1) with Tcomp(ti). That is, the controller 104 may determine that the component temperatures rose if Tcomp(ti+1) exceeds Tcomp(ti). If the intended result of reducing the component temperatures occurred, e.g., Tcomp(ti+1) is less than Tcomp(ti), then the first control scheme (scheme 1) indicated as steps 602–624 may be repeated. According to the first control scheme, when the temperatures of the components exceed a predetermined maximum set point temperature, cooling fluid delivery is increased to the components (steps 602–622).

However, if the component temperatures have risen, e.g., Tcomp(ti+1) exceeds Tcomp(ti), the panel controller 204 may decrease the airflow through the angled panel at step 630. Instead of operating under scheme 1, the panel controller 204 may operate under a second sheme (scheme 2) as indicated at step 632, which will be described in greater detail hereinbelow.

Following step 624, the temperatures of the components may be received at a second time (ti+1) at step 634. The panel controller 204 may determine whether the decrease in airflow through the angled panel (step 624) resulted in an increase in the component temperatures at step 636. In this respect, the panel controller 204 may compare the Tcomp(ti+1) with the Tcomp(ti) to determine whether the cooling fluid delivery decrease resulted in an increase in the temperatures of the components. If the Tcomp at (ti+1) is greater than the Tcomp at (ti), the first scheme (scheme 1) may be invoked by the panel controller 204.

If the temperatures of the components have been reduced, e.g., Tcomp(ti+1)<Tcomp(ti), the panel controller 204 may increase the airflow through the angled panel at step 638. In this case, again, the second scheme (scheme 2) may be invoked as indicated at step 632.

In general, according to the second scheme, the panel controller 204 operates in a substantially opposite manner to that of the first scheme. That is, for example, under the second scheme, the panel controller 204 may decrease the cooling fluid delivery to the components in response to the temperatures of the components exceeding the predetermined maximum set point temperature. In addition, the panel controller 204 may increase the cooling fluid delivery to the components in response to the temperatures of the component falling below the predetermined minimum set point temperature.

Figure 11C:
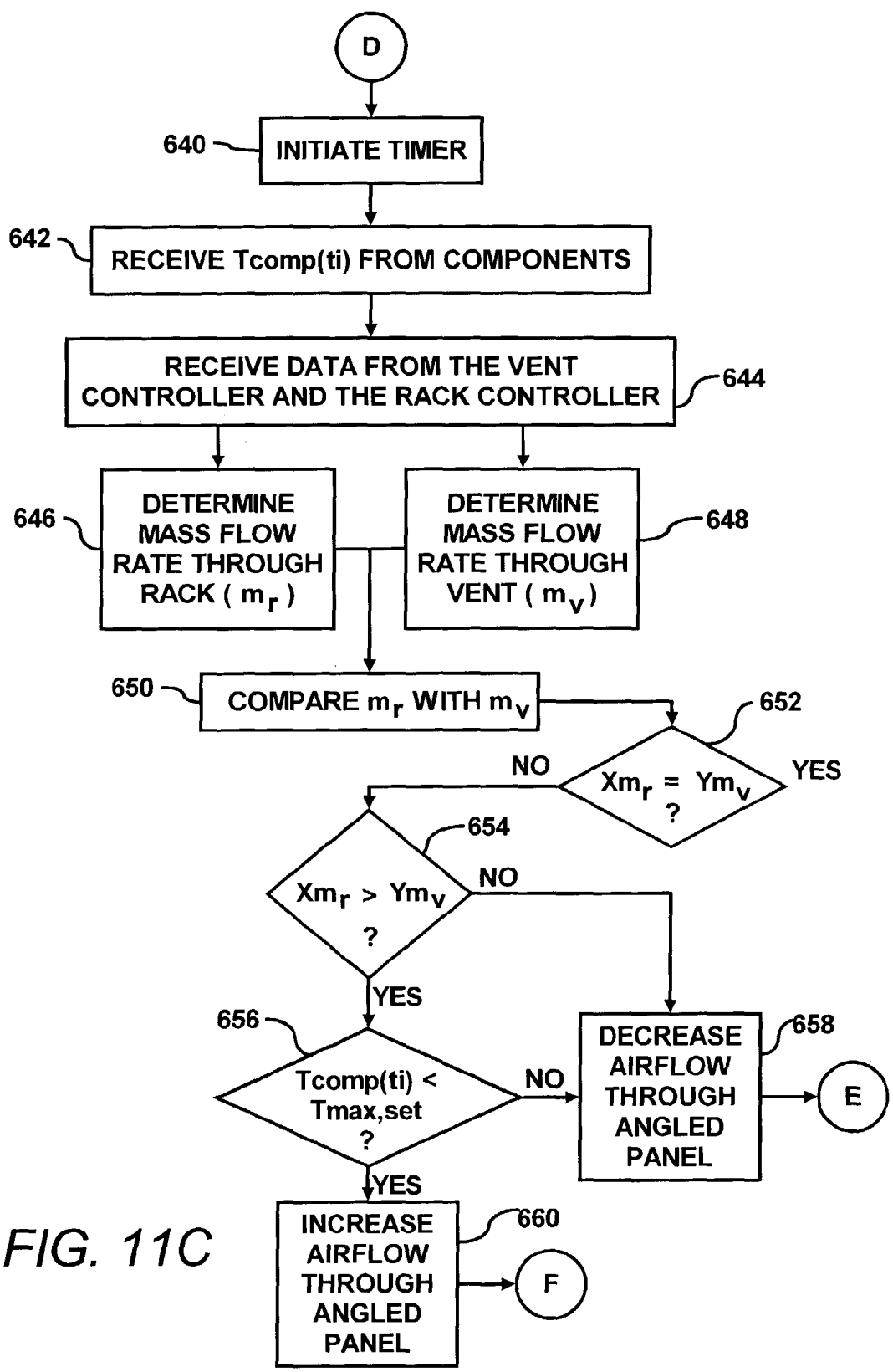
Figure 11D:
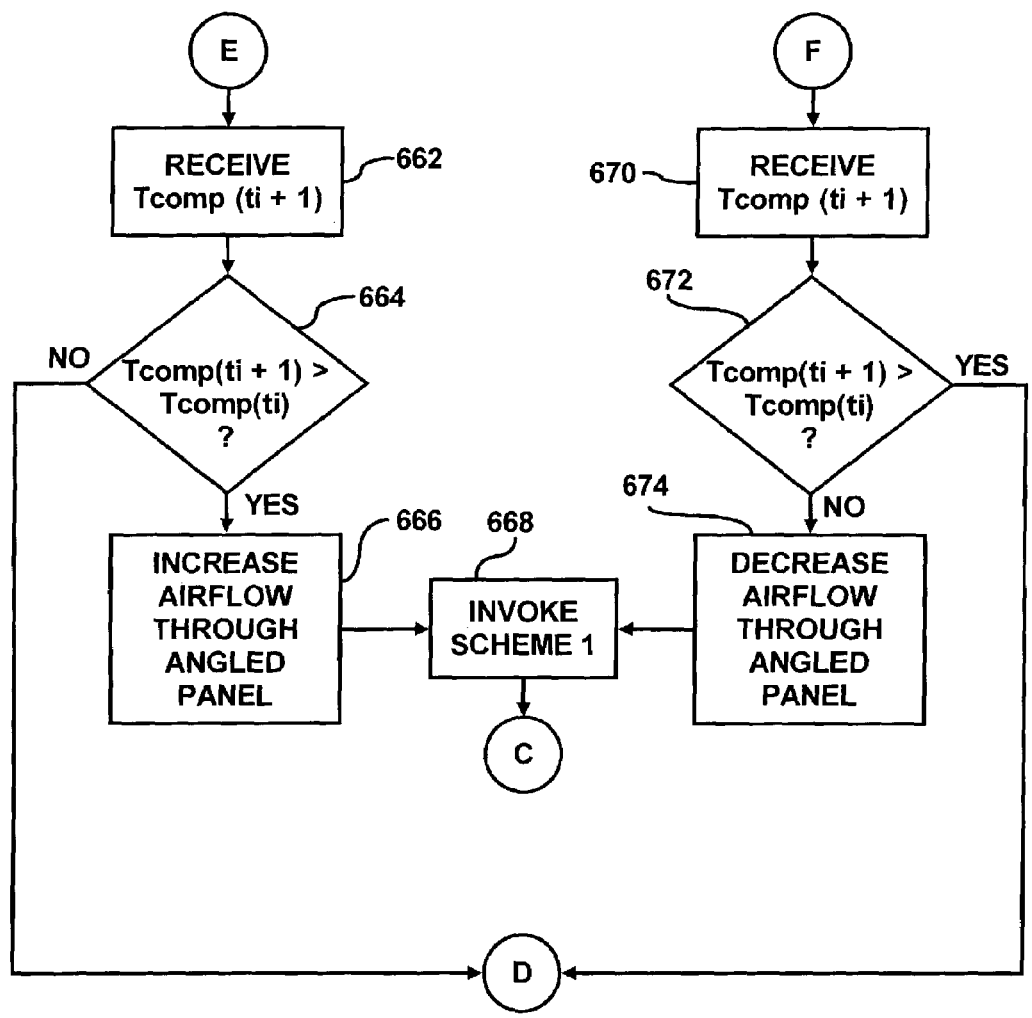

With reference now to FIG. 11C, the panel controller 204 may initiate the timer at step 640. At step 642, the panel controller 204 may receive the temperatures of the components at some time (ti). This is denoted as Tcomp(ti) in FIG. 9C. The panel controller 204 may perform steps 644–656 which are respectively equivalent to the steps 606–620 described hereinabove with respect to FIG. 11A. Due to their similarities, a description of steps 644–656 will not be set forth hereinbelow. Instead, the description of steps 606–620 is relied upon to provide adequate disclosure of steps 644–656.

At step 654, X times the mass flow rate of air through the rack is compared with Y times the mass flow rate of air through the vent. If X times the mass flow rate of air through the rack does not exceed Y times the mass flow rate of through the vent, the airflow through the angled panel may be decreased at step 658.

If X times the mass flow rate of air through the rack exceeds Y times the mass flow rate of air through the vent, the Tcomp(ti) may be compared with the Tmax,set as indicated at step 656. If the Tcomp(ti) exceeds the Tmax,set, the airflow through the angled panel may be decreased at step 658. Alternatively, if the Tcomp(ti) does not exceed the Tmax,set, the airflow through the angled panel may be increased at step 660.

Following step 658, the temperatures of the components may be received at a second time (ti+1) at step 662 (FIG. 9D). The panel controller 204 may determine whether the decrease in airflow through the angled panel resulted in a increase in the component temperatures at step 664. This determination may be made by comparing Tcomp(ti+1) with Tcomp(ti). That is, the panel controller 104 may determine that the component temperatures rose if Tcomp(ti+1) exceeds Tcomp(ti). If the intended result of reducing the component temperatures occurred, e.g., Tcomp(ti+1) is less than Tcomp(ti), then the second control scheme (scheme 2) indicated as steps 640–660 may be repeated. According to the second control scheme, when the temperatures of the components exceed a predetermined maximum set point temperature, cooling fluid delivery is decreased to the components (steps 604–658).

However, if the component temperatures have risen, e.g., Tcomp(ti+1) exceeds Tcomp(ti), the panel controller 204 may increase the airflow through the angled panel at step 666. Instead of operating under scheme 2, the panel controller 204 may operate under the first scheme (scheme 1) as indicated at step 668.

Following step 660, the temperatures of the components may be received at a second time (ti+1) at step 670. The panel controller 204 may determine whether the increase in airflow through the angled panel (step 660) resulted in an increase in the component temperatures at step 672. In this respect, the panel controller 204 may compare the Tcomp(ti+1) with the Tcomp(ti) to determine whether the cooling fluid delivery increase resulted in an increase in the temperatures of the components. If the Tcomp at (ti+1) is greater than the Tcomp at (ti), the second scheme (scheme 1) may be repeated by the panel controller 204.

If the temperatures of the components have been increased, e.g., Tcomp(ti+1) exceeds Tcomp(ti), the panel controller 204 may invoke the first scheme (scheme 1).

As described in greater detail in the co-pending applications listed hereinabove, a computational fluid dynamics (CFD) tool may be implemented to monitor the temperature of air as well as the airflow in the data center 400. In one regard, the CFD tool may be implemented to produce a numerical model of environmental conditions within the data center 400 to thus determine the manner in which cooling fluid and heated air are flowing in the data center 400. For example, the temperature of the cooling fluid exhausting from one or more vents as well as the temperature of the heated air exhausting from one or more racks may be inputted into the CFD tool. In addition, the temperature of the air at various locations throughout the data center may also be inputted into the CFD tool. The CFD tool may use this information to create a numerical model of the temperature distributions in the data center 400.

By comparing the numerical models of temperature distributions throughout the data center 400 at various times, the CFD tool may determine changes in temperature distribution in the data center 400. If the numerical models of the temperature distributions indicate that the cooling fluid is re-circulating with the heated air, the panel controller(s) 204 of various racks may manipulate one or more panels to reduce or eliminate the re-circulation. Thus, for example, if the temperature of the heated air exiting one or more racks exceeds a predetermined temperature, the panels of those racks may be manipulated to reduce the flow of cooling fluid therethrough to thereby reduce the temperature of the heated air exhausted from those racks.

As described in co-pending and commonly assigned application Ser. No. TBD, filed on Jan. 22, 2003 and entitled "Agent Based Control Method and System for Energy Management" Ser. No. 10/345,723, the disclosure of which is hereby incorporated by reference in its entirety, the angled panel openings may be considered as resources that may be traded or allocated among rack agents to distribute cooling fluid. These resources may be at the lowest tier of the resource pyramid and may be allocated first in response to a control signal. The multi-tiered and multi-agent control system may be driven by appropriate environmental conditions, e.g., temperature, pressure, humidity, combinations thereof, etc., deviations and the rack operating parameters.

By virtue of certain embodiments of the present invention, the amount of energy, and thus the costs associated with maintaining environmental conditions within a data center within predetermined operating parameters, may be substantially reduced. In one respect, by operating the cooling system to supply cooling fluid substantially only as needed by the components in the racks, the cooling system may be operated at a relatively more efficient manner in comparison with conventional cooling systems. Moreover, the temperature of the cooling fluid delivered to those components may be maintained at levels substantially equal to its temperature when it exits the vents. In addition, the temperature of the heated air delivered to an air conditioning system may also be maintained at levels substantially equal to its temperature when it exhausts from the racks. Therefore, cooling fluid may operate to remove heat from the components in the racks and the air conditioning unit may cool heated air in substantially more efficient manners over known cooing systems.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A rack comprising:
    a flame for supporting one or more electronic components, said frame having a front side and a rear side, wherein said front side contains an inlet for cooling fluid to enter into the rack and said rear side contains an outlet for air to exhaust from the rack;
    an angled panel positioned on at least one of the from side and the rear side, said angled panel extending for a substantial portion of the frame, wherein said angled panel is configured to vary airflow through the rack;
    a temperature sensor positioned to detect the temperature of the cooling fluid at the inlet;
    a temperature sensor positioned to detect the temperature of the air at the outlet; and
    a controller configured to vary the angle of the angled portion with respect to the frame based upon the detected temperatures at the inlet and the outlet.

2. The rack according to claim 1, wherein the angled panel is configured to rotate with respect to the frame, said angled panel being attached to an actuator configured to move the angled panel into various positions to thereby vary the airflow through the rack.

3. The rack according to claim 1, wherein said inlet and said outlet both comprise the angled panel.

4. The rack according to claim 1, wherein said angled panel comprises a movable louver system configured to control airflow through one or more walls of the angled panel.

5. The rack according to claim 1, wherein said one or more electronic components comprise component temperature sensors and wherein said controller is further configured to operate the angled panel based upon the temperatures detected by the component temperature sensors.

6. The rack according to claim 5, further comprising:
    a power draw sensor configured to detect the power draw of the one or more electronic components, wherein said controller is further configured to operate the angled panel based upon the power draw detected by the power draw sensor.

7. The rack according to claim 1, wherein said rear side comprises the angled panel and wherein said angled panel of the rear side is configured to control one or both of the mass flow rate and direction of airflow out of the rack.

8. The rack according to claim 1, wherein at least one of said front side and said rear side comprises a plurality of angled portions located at various positions along the height of one or more of the front side and the rear side.

9. A system for reducing re-circulation of air in a data center, said system comprising:
    a rack comprising:
        one or more electronic components;
        an angled panel positioned to vary airflow through the rack;
        an inlet temperature sensor configured to detect the temperature of cooling fluid delivered into the rack;
        an outlet temperature sensor configured to detect the temperature of heated air exhausted from the rack;
        an actuator configured to manipulate the angled panel; and
        a controller configured to operate the actuator substantially based on the temperatures detected by the inlet temperature sensor and the outlet temperature sensor to thereby vary the airflow through the rack and reduce re-circulation of air in the data center.

10. The system according to claim 9, wherein said one or more electronic components comprises an electronic component temperature sensor, said electronic component temperature sensor being in communication with said controller, wherein said controller is further configured to operate the actuator substantially based on the temperature(s) of the one or more electronic components.

11. The system according to claim 10, further comprising:
a memory associated with the controller, said controller being configured to access said memory to determine an actuator operation based upon the detected temperatures.

12. The system according to claim 10, further comprising:
a plurality of angled panels positioned at various locations of the rack, wherein said controller is configured to substantially independently control the plurality of angled panels to enable substantially varied airflow through various sections of the rack.

13. The system according to claim 9, further comprising:
a component power draw sensor, said component power draw sensor being in communication with said controller, and wherein said controller is further configured to operate the actuator substantially based on the power draw of the one or more electronic components.

14. A method for cooling one or more electronic components housed in a rack, said method comprising:
receiving sensed temperatures of the one or more electronic components;
determining whether the sensed temperatures are within predetermined ranges;
determining whether the sensed temperatures are above predetermined maximum set point temperatures;
manipulating an angled panel in response to the sensed temperatures of the one or more electronic components being outside of the predetermined ranges to thereby vary the flow of cooling fluid delivery to the one or more electronic components by increasing the cooling fluid delivery to the one or more electronic components in response to the sensed temperatures being above the predetermined maximum set point temperatures; and
decreasing the cooling fluid delivery to the one or more electronic components in response to the sensed temperatures being below the predetermined maximum set point temperatures.

15. The method according to claim 14, further comprising:
receiving a second sensed temperature of the at least one component;
comparing the second sensed temperature with the sensed temperature to determine whether a first manipulation of the angled panel resulted in an intended outcome; and
manipulating the angled panel in an opposite manner to the first manipulation in response to the first manipulation resulting in an unintended outcome.

16. The method according to claim 14, further comprising:
determining whether the sensed temperature is above a predetermined maximum set point temperature;
decreasing the cooling fluid delivery to the at least one electronic component in response to the sensed temperature being above the predetermined maximum set point temperature; and increasing the cooling fluid delivery to the at least one electronic component in response to the sensed temperature being below the predetermined maximum set point temperature.

17. The method according to claim 14, further comprising:
receiving sensed temperatures of a plurality of electronic components;
determining whether the sensed temperatures are within predetermined ranges, and
wherein said step of manipulating comprises manipulating a plurality of angled panels in substantially independent manners in response to the sensed temperatures of the plurality of electronic components being outside of the predetermined ranges to thereby vary the flow of cooling fluid delivery to the plurality of electronic components.

18. A system for cooling one or more electronic components in a rack, said system comprising:
means for sensing the temperatures of the one or more electronic components;
means for determining whether the sensed temperatures are within a predetermined range;
means for determining whether the sensed temperatures are above or below predetermined maximum set point temperatures;
means for manipulating the airflow through the rack in response to the sensed temperatures of the one or more electronic components being outside of the predetermined range to thereby vary the flow of cooling fluid delivery to the one or more electronic components by increasing the cooling fluid delivery to the one or more electronic components in response to the sensed temperatures being above the predetermined maximum set point temperatures; and
decreasing the cooling fluid delivery to the one or more electronic components in response to the sensed temperatures being below the predetermined maximum set point temperature.

19. The system according to claim 18, further comprising:
means for determining whether the sensed temperatures are above predetermined maximum set point temperatures;
means for increasing the cooling fluid delivery to the one or more electronic components in response to the sensed temperature being above the predetermined maximum set point temperatures; and
means for decreasing the cooling fluid delivery to the one or more electronic components in response to the sensed temperature being below the predetermined maximum set point temperatures.

20. The method according to claim 18, further comprising:
means for receiving a second sensed temperature of the at least one component;
means for comparing the second sensed temperature with the sensed temperature to determine whether a first manipulation of the angled panel resulted in an intended outcome; and
means for manipulating the angled panel in an opposite manner to the first manipulation in response to the first manipulation resulting in an unintended outcome.

21. A method for retrofitting a rack designed to house a plurality of electronic components, said method comprising:
removing at least one of a front panel and a rear panel of the rack;

installing an angled panel in place of the removed at least one front panel and rear panel, said angled panel being configured to control the airflow through the rack;

installing an actuator configured to move the angled panel between a plurality of positions with respect to the rack; and installing a controller configured to control the actuator to thereby vary the position of the angled panel and the airflow through the rack.

22. The method according to claim 21, further comprising:

installing an inlet temperature sensor at an inlet of the rack;

installing an outlet temperature sensor at an outlet of the rack;

configuring said controller to receive information related to detected temperatures by said inlet temperature sensor and said outlet temperature sensor; and manipulating the angled panel based upon the information received from said inlet temperature sensor and said outlet temperature sensor.

23. A data center comprising:

a rack housing one or more electronic components and having an inlet and an outlet, said rack having an angled panel positioned on at least one of the inlet and the outlet of the rack;

a cooling system operable to supply said rack with cooling fluid to thereby cool the one or more electronic components;

a temperature sensor positioned to detect the temperature of the cooling fluid at the inlet;

a temperature sensor positioned to detect the temperature of air at the outlet;

a panel controller configured to vary the angle of the angled panel with respect to the rack to vary the airflow through the rack based upon the detected temperatures at the inlet and the outlet.

24. The data center according to claim 23, wherein said cooling system comprises:

a vent having a vent controller configured to determine airflow through said vent;

a plenum positioned to supply the vent with cooling fluid, and a pressure sensor configured to measure the pressure within the plenum.

25. The data center according to claim 24, wherein the panel controller is in communication with the vent controller and the pressure sensor, and wherein the panel controller is configured to vary the angle of the angled panel in response to data received from said vent controller and the pressure sensor.

26. The data center according to claim 24, wherein said rack further comprises:

a component temperature sensor positioned to detect the temperatures of the one or more electronic components, and wherein the panel controller is in communication with said inlet temperature sensor, said outlet temperature sensor, and said component temperature sensor, and wherein said panel controller is configured to vary the angle of the angled panel in response to data received from said inlet temperature sensor, said outlet temperature sensor, and said component temperature sensor.

27. The data center according to claim 23, wherein said rack comprises a power draw sensor configured to detect the power supplied to the one or more electronic components, wherein said panel controller is in communication with said power draw sensor, and wherein said panel controller is configured to vary the angle of the angled panel in response to data received from said power draw sensor.

28. The data center according to claim 23, further comprising:

a plurality of racks having angled panels; and wherein the plurality of racks comprise panel controllers, said panel controllers being configured to operate the angled panels to reduce re-circulation of the cooling fluid with air heated in the racks.

29. The data center according to claim 23, further comprising:

a mobile device configured to detect one or more environmental conditions in the data center; said mobile device being in communication with the panel controller, and wherein said panel controller is configured to operate the angled panel in response to data received from the mobile device.

30. The data center according to claim 23, further comprising:

a return configured to receive heated air from the rack, wherein said panel controller is configured to manipulate the angled panel to direct heated airflow in the general direction of the return.

31. The data center according to claim 23, further comprising:

a heat exchanger unit having an intake configured to receive heated air from the rack, a heat exchanger configured to cool the heated air, and an exhaust configured to supply the cooled air to the rack, wherein said panel controller is configured to manipulate an angled panel located on the outlet of the rack to direct heated airflow in the general direction of the intake.

32. The data center according to claim 23, wherein panel controller is configured to manipulate an angled panel located on the inlet of the rack to receive cooled air from the exhaust.

33. A method of reducing re-circulation of air in a data center having at least one rack and at least one vent for supplying cooling fluid to the at least one rack, said at least one rack having an angled panel, said method comprising:

determining the mass flow rate of airflow through the at least one rack;

determining the mass flow rate of airflow through the at least one vent;

comparing the mass flow rate of airflow through the at least one rack and the at least one vent; and manipulating the angled panel in response to the comparison of the mass flow rates through the at least one rack and the at least one vent to reduce re-circulation of air in the data center.

34. The method according to claim 33, wherein said step of determining the mass flow rate of airflow through the at least one rack comprises calculating the mass flow rate of airflow through the at least one rack on temperature measurements from a plurality of temperature sensors and power supply measurements from a power draw sensor.

35. The method according to claim 33, wherein said step of determining the mass flow rate of airflow through the at least one rack comprises measuring the mass flow rate of airflow through the at least one rack.

36. The method according to claim 33, wherein said step of determining the mass flow rate of airflow through the at least one vent comprises basing the determination of the mass flow rate of airflow through the at least one vent on information received from a vent controller and pressure measurements from a pressure sensor located in a cooling fluid supply plenum of the data center.

37. The method according to claim 33, further comprising:
   determining a conversion factor to compare the mass flow rate of airflow through the at least one rack and the mass flow rate of airflow through the at least one vent, wherein the conversion factor is based upon a substantially optimal mass flow rate difference that reduces or eliminates re-circulation of cooling fluid with heated air; and
   wherein the step of comparing the mass flow rate of airflow through the at least one rack and the mass flow rate of airflow through the at least one vent comprises comparing the mass flow rates of airflow through the at least one rack and the at least one vent based upon the conversion factor.

38. The method according to claim 37, further comprising:
   determining whether the converted mass flow rate of airflow through the at least one rack is greater than the converted mass flow rate of airflow through the at least one vent; and
   manipulating the angled panel in response to the converted mass flow rate of airflow through the at least one rack differing from the converted mass flow rate of the airflow through the at least one vent.

39. The method according to claim 38, further comprising:
   increasing the mass flow rate of airflow through the at least one rack in response to the converted mass flow rate of the airflow through the at least one vent exceeding the converted mass flow rate of airflow through the at least one rack.

40. The method according to claim 38, further comprising:
   determining the temperatures of the one or more components in the at least one rack;
   determining whether the temperatures of the one or more components are below predetermined maximum temperatures;
   manipulating the angled panel to increase the mass flow rate of airflow through the at least one rack in response to the temperatures of the one or more components exceeding the predetermined maximum temperatures; and
   manipulating the angled panel to decrease the mass flow rate of airflow through the at least one rack in response to the temperatures of the one or more components falling below the predetermined maximum temperatures.

41. The method according to claim 40, further comprising:
   receiving a second sensed temperature of the one or more components;
   comparing the second sensed temperature with the sensed temperature to determine whether a first manipulation of the angled panel resulted in an intended outcome; and
   manipulating the angled panel in an opposite manner to the first manipulation in response to the first manipulation resulting in an unintended outcome.

42. The method according to claim 38, further comprising:
   determining the temperatures of one or more components in the at least one rack;
   determining whether the temperatures of the one or more components in the at least one rack is below a predetermined maximum temperature;
   manipulating the angled panel to decrease the mass flow rate of airflow through the rack in response to the temperatures of the one or more components exceeding the predetermined maximum temperature; and
   manipulating the angled panel to increase the mass flow rate of airflow through the rack in response to the temperatures of the one or more components falling below the predetermined maximum temperature.

43. The method according to claim 33, further comprising:
   performing a numerical modeling of a temperature distribution and characteristics of airflow in the data center; and
   manipulating the angled panel in response to the numerical modeling to reduce re-circulation of airflow in the data center.

44. The method according to claim 33, further comprising:
   implementing a plurality of angled panels of a plurality of racks as resources; and
   performing one or more of trading and allocating the resources as rack agents to distribute cooling fluid to the plurality of racks.

45. A computer readable storage medium on which is embedded one or more computer programs, said one or more computer programs implementing a method of reducing re-circulation of air in a data center having at least one rack and at least one vent for supplying cooling fluid to the at least one rack, said at least one rack having an angled panel, said one or more computer programs comprising a set of instructions for:
   determining the mass flow rate of airflow through the at least one rack;
   determining the mass flow rate of airflow through the at least one vent;
   comparing the mass flow rate of airflow through the at least one rack and the at least one vent; and
   manipulating the angled panel in response to the comparison of the mass flow rates through the at least one rack and the at least one vent to thereby reduce re-circulation of air in the data center.

46. The computer readable storage medium according to claim 45, said one or more computer programs further comprising a set of instructions for:
   determining a conversion factor to compare the mass flow rate of airflow through the at least one rack and the mass flow rate of airflow through the at least one vent, wherein the conversion factor is based upon a substantially optimal mass flow rate difference that reduces or eliminates re-circulation of cooling fluid with heated air, and
   wherein the step of comparing the mass flow rate of airflow through the at least one rack and the mass flow rate of airflow through the at least one vent comprises comparing the mass flow rates of airflow through the at least one rack and the at least one vent based upon the conversion factor.

47. The computer readable storage medium according to claim 46, said one or more computer programs further comprising a set of instructions for:
   determining whether the converted mass flow rate of airflow through the at least one rack is greater than the converted mass flow rate of airflow through the at least one vent; and manipulating the angled panel in response to the converted mass flow rate of airflow through the at least one rack differing from the converted mass flow rate of the airflow through the at least one vent.

48. The computer readable storage medium according to claim 46, said one or more computer programs further comprising a set of instructions for:
   increasing the mass flow rate of airflow through the at least one rack in response to the converted mass flow rate of the airflow through the at least one vent exceeding the converted mass flow rate of airflow through the at least one rack.

49. The computer readable storage medium according to claim 46, said one or more computer programs further comprising a set of instructions for:
   determining the temperatures of one or more components in the at least one rack;
   determining whether the temperatures of the one or more components are below predetermined maximum temperatures;
   manipulating the angled panel to increase the mass flow rate of airflow through the at least one rack in response to the temperatures of the one or more components exceeding the predetermined maximum temperatures; and
   manipulating the angled panel to decrease the mass flow rate of airflow through the at least one rack in response to the temperatures of the one or more components falling below the predetermined maximum temperatures.

50. The computer readable storage medium according to claim 49, said one or more computer programs further comprising a set of instructions for:
   receiving a second sensed temperature of the one or more components;
   comparing the second sensed temperature with the sensed temperature to determine whether a first manipulation of the angled panel resulted in an intended outcome; and
   manipulating the angled panel in an opposite manner to the first manipulation in response to the first manipulation resulting in an unintended outcome.

51. The computer readable storage medium according to claim 46, said one or more computer programs further comprising a set of instructions for:
   determining the temperatures of one or more components in the at least one rack;
   determining whether the temperatures of the one or more components in the at least one rack is below a predetermined maximum temperature;
   manipulating the angled panel to decrease the mass flow rate of airflow through the rack in response to the temperatures of the one or more components exceeding the predetermined maximum temperature; and
   manipulating the angled panel to increase the mass flow rate of airflow through the rack in response to the temperatures of the one or more components falling below the predetermined maximum temperature.

* * * * *

UNITED STATES PATENT AND TRADEMARK OFFICE
CERTIFICATE OF CORRECTION

PATENT NO. : 7,170,745 B2
APPLICATION NO. : 10/425624
DATED : January 30, 2007
INVENTOR(S) : Cullen Edwin Bash et al.

Page 1 of 1

It is certified that error appears in the above-identified patent and that said Letters Patent is hereby corrected as shown below:

In column 4, line 57, delete "arid" and insert -- and --, therefor.

In column 28, line 7, in Claim 1, delete "flame" and insert -- frame --, therefor.

In column 28, line 12, in Claim 1, delete "from" and insert -- front --, therefor.

In column 30, line 40, in Claim 18, delete "temperature" and insert -- temperatures --, therefor.

In column 31, line 28, in Claim 23, after "fluid" insert -- at the inlet --.

In column 33, line 11, in Claim 37, delete "air;" and insert -- air, --, therefor.

Signed and Sealed this

Fifteenth Day of December, 2009

David J. Kappos
*Director of the United States Patent and Trademark Office*